(12) United States Patent
Shiraishi et al.

(10) Patent No.: US 10,482,977 B2
(45) Date of Patent: Nov. 19, 2019

(54) SEMICONDUCTOR MEMORY DEVICE

(71) Applicant: TOSHIBA MEMORY CORPORATION, Tokyo (JP)

(72) Inventors: Kei Shiraishi, Kawasaki Kanagawa (JP); Masaru Koyanagi, Ota Tokyo (JP); Mikihiko Ito, Ota Tokyo (JP); Yasuhiro Hirashima, Kawasaki Kanagawa (JP)

(73) Assignee: TOSHIBA MEMEORY CORPORATION, Tokyo (JP)

( * ) Notice: Subject to any disclaimer, the term of this patent is extended or adjusted under 35 U.S.C. 154(b) by 0 days.

(21) Appl. No.: 15/912,282

(22) Filed: Mar. 5, 2018

(65) Prior Publication Data
US 2019/0080769 A1   Mar. 14, 2019

(30) Foreign Application Priority Data

Sep. 14, 2017 (JP) ................... 2017-176626

(51) Int. Cl.
*G11C 5/14* (2006.01)
*G11C 16/22* (2006.01)
*H02H 9/04* (2006.01)
*G11C 7/10* (2006.01)
*G11C 16/30* (2006.01)
*G11C 16/26* (2006.01)
*G11C 16/10* (2006.01)

(52) U.S. Cl.
CPC ............. *G11C 16/22* (2013.01); *G11C 5/143* (2013.01); *G11C 7/109* (2013.01); *G11C 7/1078* (2013.01); *G11C 16/30* (2013.01); *H02H 9/046* (2013.01); *G11C 16/10* (2013.01); *G11C 16/26* (2013.01)

(58) Field of Classification Search
CPC ... H02H 9/046; H01L 27/0285; H01L 27/092; G11C 5/14
USPC ..................... 361/56, 111; 365/226
See application file for complete search history.

(56) References Cited

U.S. PATENT DOCUMENTS 6,690,561 B2   2/2004  Hung et al.
7,061,052 B2 * 6/2006  Kato ................... H01L 27/0251
                                                                257/355
8,148,782 B2 * 4/2012  Fukuda ................. H01L 21/84
                                                                257/355

(Continued)

FOREIGN PATENT DOCUMENTS

JP      2009-267072 A   11/2009
JP      6199768 B2       5/2013

(Continued)

*Primary Examiner* — Son L Mai
(74) *Attorney, Agent, or Firm* — Kim & Stewart LLP

(57) ABSTRACT

A semiconductor memory device includes a first transistor including a first end connected to a first pad and a second end connected to a first node, a second transistor including a first end connected to a second pad and a second end connected to the first node, a third transistor including a first end connected to the second pad, a second end connected to the first node, and a gate connected to a second node and having a size different from that of the second transistor, a fourth transistor including a first end connected to the first pad, a second end connected to the second node, and a gate connected to the first node, and a fifth transistor including a first end connected to the second pad, a second end connected to the second node, and a gate connected to the first node.

19 Claims, 25 Drawing Sheets

(56) References Cited

U.S. PATENT DOCUMENTS

| | | | |
|---|---|---|---|
| 8,711,533 B2 * | 4/2014 | Tatsumi | H01L 27/0285 361/111 |
| 9,899,385 B2 * | 2/2018 | Yamazaki | H01L 21/823842 |
| 2009/0268360 A1 | 10/2009 | Shinomiya et al. | |
| 2014/0334046 A1 | 11/2014 | Haruki et al. | |

FOREIGN PATENT DOCUMENTS

| | | |
|---|---|---|
| JP | 2014-241393 A | 12/2014 |
| JP | 2015-103689 A | 6/2015 |
| TW | 694973 B | 6/2004 |

* cited by examiner

SEMICONDUCTOR MEMORY DEVICE

CROSS-REFERENCE TO RELATED APPLICATION

This application is based upon and claims the benefit of priority from Japanese Patent Application No. 2017-176626, filed Sep. 14, 2017, the entire contents of which are incorporated herein by reference.

FIELD

Embodiments described herein relate generally to a semiconductor memory device.

BACKGROUND

NAND flash memory is known as one type of semiconductor memory device.

DETAILED DESCRIPTION

Figure 1:
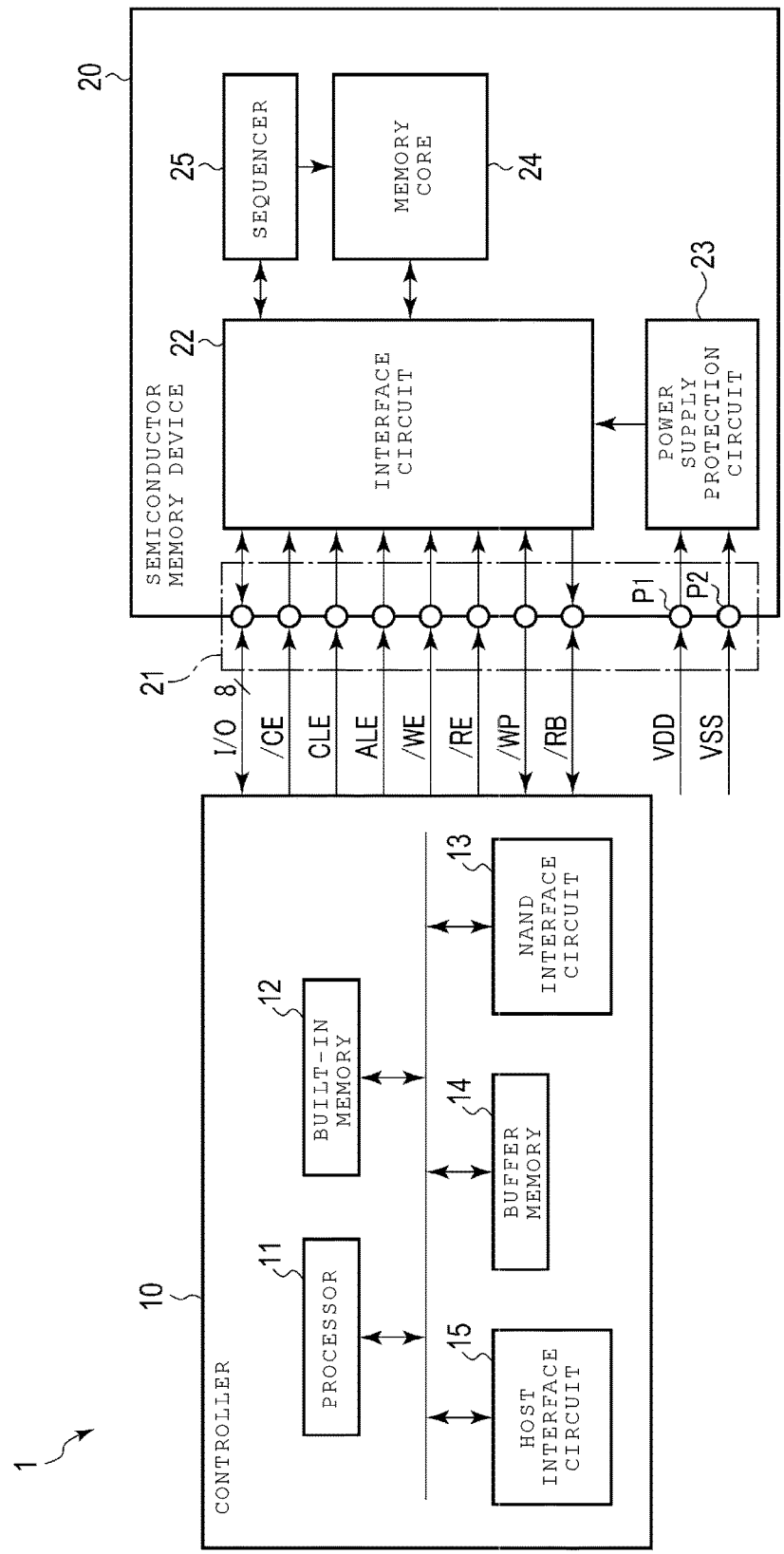
FIG. 1 is a block diagram of a memory system according to a first embodiment.

Embodiments reduce a through current flowing in a semiconductor memory device when power to the device is turned on.

In general, according to an embodiment, a semiconductor memory device includes a first pad to which a first voltage is supplied, a second pad to which a second voltage different from the first voltage is supplied, and a power supply protection circuit. The power supply protection circuit includes a first transistor, a second transistor, a third transistor, a fourth transistor, and a fifth transistor. The first transistor includes a first end electrically connected to the first pad and a second end electrically connected to a first node. The second transistor includes a first end electrically connected to the second pad and a second end electrically connected to the first node. The third transistor includes a first end electrically connected to the second pad, a second end electrically connected to the first node, and a gate electrically connected to a second node, and has a size different from that of the second transistor. The fourth transistor includes a first end electrically connected to the first pad, a second end electrically connected to the second node, and a gate electrically connected to the first node. The fifth transistor includes a first end electrically connected to the second pad, a second end electrically connected to the second node, and a gate electrically connected to the first node.

Hereinafter, embodiments will be described with reference to the drawings. In the following description, elements having the same functions and configurations are denoted by the same reference numerals.

1. First Embodiment

A semiconductor memory device according to a first embodiment will be described. The semiconductor memory device according to the first embodiment includes, for example, a NAND flash memory.

1.1. Regarding Configuration

First, a configuration of the memory system according to the first embodiment will be described.

1.1.1 Regarding Entire Configuration of Memory System

FIG. 1 is a block diagram for explaining a configuration of a memory system according to a first embodiment. A memory system 1 communicates with, for example, an external host device (not illustrated). The memory system 1 holds data from the host device and reads out the data to the host device.

As illustrated in FIG. 1, the memory system 1 includes a controller 10 and a semiconductor memory device 20. The controller 10 receives a command from the host device and controls the semiconductor memory device 20 based on the received command. Specifically, the controller 10 writes data, which is instructed to be written from the host device, into the semiconductor memory device 20, reads data, which is instructed to be read from the host device, from the semiconductor memory device 20, and transmits the read data to the host device. The controller 10 is connected to the semiconductor memory device 20 by a NAND bus. The semiconductor memory device 20 includes a plurality of memory cells and functions as a NAND flash memory in which data is stored to be nonvolatile, for example. The memory cell is not limited thereto, and data may be stored to be volatile.

The NAND bus transmits and receives signals /CE, CLE, ALE, /WE, /RE, /WP, /RB, and I/O according to a NAND interface. The signal /CE is a signal for enabling the semiconductor memory device 20. The signal CLE notifies the semiconductor memory device 20 that the signal I/O transmitted to the semiconductor memory device 20 while the signal CLE is at a "H (High)" level is a command. The signal ALE notifies the semiconductor memory device 20 that the signal I/O transmitted to the semiconductor memory device 20 while the signal ALE is at the "H" level is an address. The signal /WE instructs the semiconductor memory device 20 to capture the signal I/O transmitted to semiconductor memory device 20 while the signal /WE is at a "L (Low)" level. The signal /RE instructs the semiconductor memory device 20 to output the signal I/O. The signal /WP instructs semiconductor memory device 20 to prohibit data write and data erasure. The signal /RB indicates whether the semiconductor memory device 20 is in a ready state (a state in which it is ready to accept an instruction from the outside) or a busy state (a state in which it is not ready to accept an instruction from the outside). The signal I/O is, for example, an 8-bit signal, and each bit of the 8-bit signal is transmitted and received through a different signal line. The signal I/O is a unit of data transmitted and received between the semiconductor memory device 20 and the controller 10, and includes a command, an address, and data. The data includes, for example, write data and read data.

Various voltages are supplied to the semiconductor memory device 20. The voltages supplied to the semiconductor memory device 20 include, for example, voltages VDD and VSS. The voltage VDD is a voltage supplied to drive various circuits in the semiconductor memory device 20, and is, for example, 1.8 V. The voltage VSS is a ground voltage and is lower than the voltage VDD. The voltage VSS is, for example, 0 V.

1.1.2 Regarding Configuration of Controller

Subsequently, using FIG. 1, a controller of the memory system according to the first embodiment will be explained. A controller 10 includes a processor (central processing unit (CPU)) 11, a built-in memory (random access memory (RAM)) 12, a NAND interface circuit 13, a buffer memory 14, and a host interface circuit 15.

The processor 11 controls the overall operation of the controller 10. The processor 11 issues a write command to the semiconductor memory device 20 based on a NAND interface standard, for example, in response to a write command of data received from the host device. This operation is also applied to a case of data read and data erasure.

The built-in memory 12 is a semiconductor memory such as a dynamic RAM (DRAM), for example, and is used as a work area of the processor 11. The built-in memory 12 holds firmware for managing the semiconductor memory device 20, various management tables, and the like.

The NAND interface circuit 13 is connected to the semiconductor memory device 20 through the NAND bus and is responsible for communication with the semiconductor memory device 20. The NAND interface circuit 13 transmits the command, the address, and the write data to the semiconductor memory device 20 according to the instruction of the processor 11. Further, the NAND interface circuit 13 receives read data from the semiconductor memory device 20.

The buffer memory 14 temporarily holds data and the like received by the controller 10 from the semiconductor memory device 20 and the host device.

The host interface circuit 15 is connected to the host device and is responsible for communication with the host device. The host interface circuit 15 transfers, for example, instructions and data received from the host device to the processor 11 and the buffer memory 14, respectively.

1.1.3 Regarding Configuration of Semiconductor Memory Device

Subsequently, a configuration example of the semiconductor memory device according to the first embodiment will be described using FIG. 1. The semiconductor memory device 20 includes a pad group 21, an interface circuit 22, a power supply protection circuit 23, a memory core 24, and a sequencer 25.

The pad group 21 includes a plurality of pads for signal transmission and reception. The pad group 21 transfers the signals /CE, CLE, ALE, /WE, /RE, /WP, and I/O received from the controller 10 to the interface circuit 22. The pad group 21 includes eight pads (only one illustrated) corresponding to signal lines of respective bits of the signal I/O. Further, the pad group 21 transfers the signal /RB received from the interface circuit 22 to the outside of the semiconductor memory device 20.

Further, the pad group 21 includes pads P1 and P2 for voltage supply. The pad P1 supplies a voltage VDD to the power supply protection circuit 23 and the pad P2 supplies a voltage VSS to the power supply protection circuit 23.

The interface circuit 22 transmits commands and addresses in the signal I/O to the sequencer 25, and transmits and receives data to and from the memory core 24.

The power supply protection circuit 23 supplies the voltage VDD to the interface circuit 22. The power supply protection circuit 23 supplies the interface circuit 22 with the voltage VDD obtained by reducing a surge based on the voltages VDD and VSS, for example, in a case where the surge occurs in the voltage VDD. Details of the power supply protection circuit 23 will be described later.

The memory core 24 includes a memory cell array (not illustrated) including a plurality of memory cells that store data. The memory core 24 is configured so that data read and data write for the memory cell array can be performed.

The sequencer 25 receives the command and controls the entire semiconductor memory device 20 according to a sequence based on the received command.

1.1.4 Regarding Configuration of Power Supply Protection Circuit

Next, the configuration of the power supply protection circuit of the semiconductor memory device according to the first embodiment will be described with reference to FIG. 2.

Figure 2:
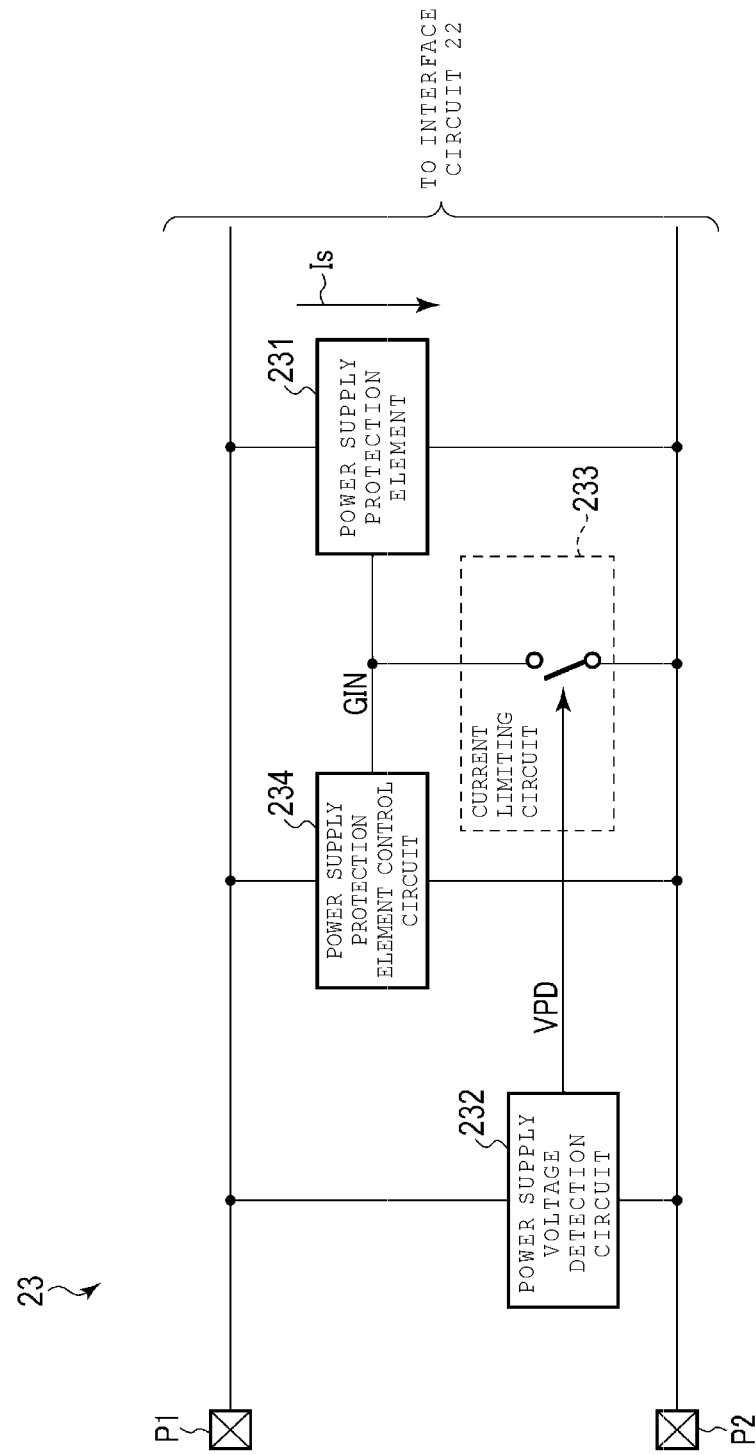
FIG. 2 is a block diagram of a power supply protection circuit of a semiconductor memory device according to the first embodiment.

As illustrated in FIG. 2, the power supply protection circuit 23 includes a power supply protection element 231, a power supply voltage detection circuit 232, a current limiting circuit 233, and a power supply protection element control circuit 234.

As described above, the power supply protection circuit 23 is supplied with the voltages VDD and VSS through the pads P1 and P2, respectively.

The power supply protection element 231 includes a first end connected to the pad P1 and a second end connected to the pad P2. The power supply protection element 231 protects the interface circuit 22 by allowing the ON current $I_s$ to flow to the pad P2 from the pad P1 in a case where a surge is applied to the pad P1, for example. The power supply protection element 231 further includes, for example, an input end connected to a node GIN. By receiving the control signal from the power supply protection element control circuit 234 through the node GIN, the power supply protection element 231 can switch whether the ON current $I_s$ is to flow or not.

The power supply voltage detection circuit 232 includes a first end connected to the pad P1, a second end connected to the pad P2, and an output end connected to a node VPD. The power supply voltage detection circuit 232 detects a voltage difference between the pads P1 and P2 and outputs a signal to the current limiting circuit 233 through the node VPD according to magnitude of the voltage difference. For example, in a case where the voltage difference between the pads P1 and P2 does not exceed a certain threshold value, the power supply voltage detection circuit 232 can output a signal for turning on a switch of the current limiting circuit 233, and in a case where the voltage difference between the pads P1 and P2 exceeds the threshold value, the power supply voltage detection circuit 232 can output a signal for turning off the switch of the current limiting circuit 233. As the threshold value set in the power supply voltage detection circuit 232, for example, a voltage value capable of determining whether a surge is applied or not can be set. Specifically, it is desirable that the threshold value is set to a value which is greater than or equal to the voltage value (VDD) normally supplied to the interface circuit 22 and less than a voltage value which is likely to destroy the elements in the interface circuit 22.

The current limiting circuit 233 includes a switch including a first end connected to the node GIN, a second end connected to the pad P2, and an input end connected to the node VPD. The current limiting circuit 233 electrically connects the node GIN to the pad P2 by, for example, turning on the switch and electrically disconnects the node GIN from the pad P2 by turning off the switch.

The power supply protection element control circuit 234 includes a first end connected to the pad P1, a second end connected to the pad P2, and an output end connected to the node GIN. The power supply protection element control circuit 234 can output a control signal instructing the power supply protection element 231 to allow the ON current $I_s$ to flow, through the node GIN according to the voltage difference between the pads P1 and P2. The control signal becomes valid in a case where the switch of the current limiting circuit 233 is off, and becomes invalid when the current limiting circuit 233 is on.

With the configuration as described above, the power supply protection element 231 and the power supply protection element control circuit 234 can allow the ON current $I_s$ to flow in accordance with the voltage difference between the pads P1 and P2 to protect the interface circuit 22. In addition, in a case where the power supply protection element control circuit 234 outputs a control signal to the power supply protection element 231 to cause the ON current $I_s$ to flow even when the ON current $I_s$ does not need to flow, the power supply voltage detection circuit 232 and the current limiting circuit 233 can cut off or limit the control signal so as to make it possible to prevent the ON current $I_s$ from flowing.

Figure 3:
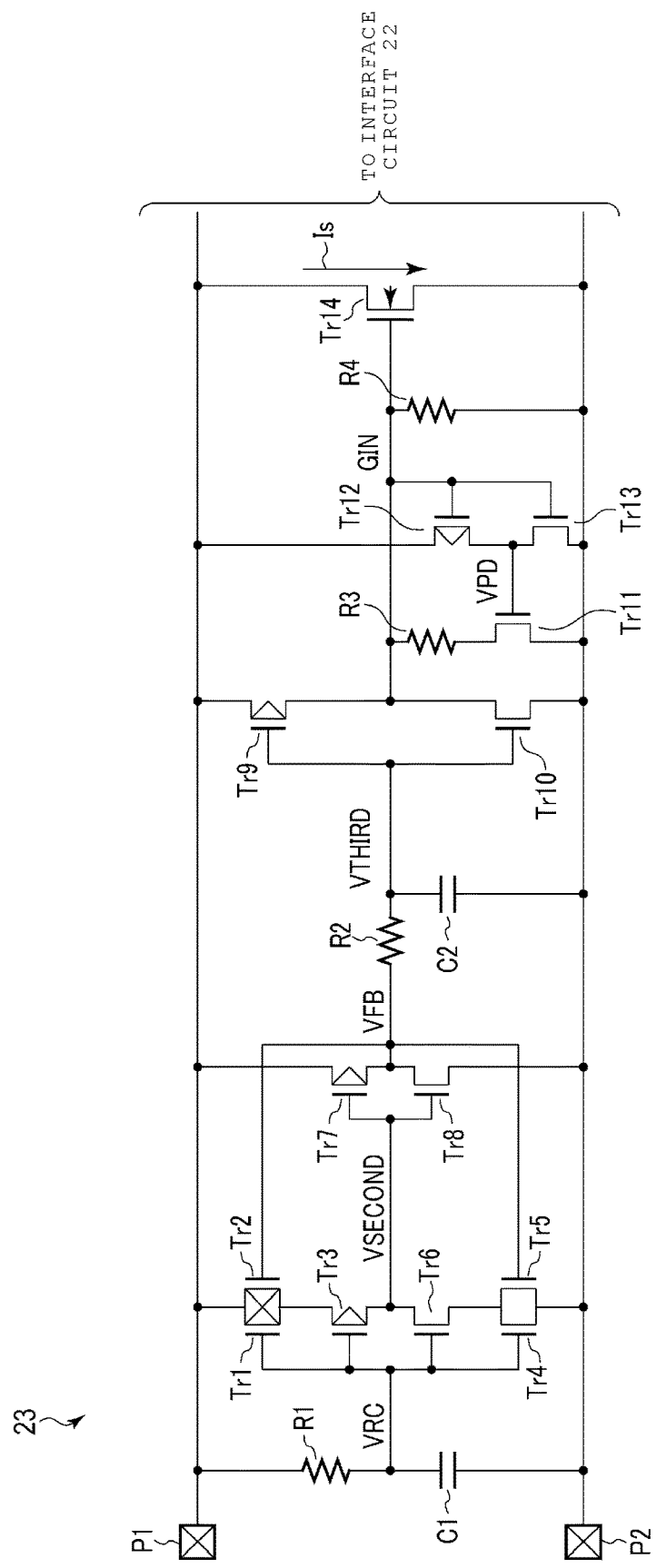
FIG. 3 is a circuit diagram of the power supply protection circuit of the semiconductor memory device according to the first embodiment.

A specific circuit configuration of the power supply protection circuit 23 described above will be described using FIG. 3. In FIG. 3, a case where the power supply protection element 231 and the power supply protection element control circuit 234 are each a resistance capacitor triggered metal oxide semiconductor (RCTMOS) circuits is illustrated as an example.

As illustrated in FIG. 3, the power supply protection circuit 23 includes transistors Tr1, Tr2, Tr3, Tr4, Tr5, Tr6, Tr7, Tr8, Tr9, Tr10, Tr11, Tr12, Tr13 and Tr14, resistors R1, R2, R3, and R4, and capacitors C1 and C2. For example, the transistors Tr1 to Tr3, Tr7, Tr9 and Tr12 have p channel polarities, respectively. For example, the transistors Tr4 to Tr6, Tr8, Tr10, Tr11, Tr13, and Tr14 have n channel polarities respectively.

The transistor Tr14 functions, for example, as the power supply protection element 231. The transistors Tr9 and Tr11 to Tr13 and the resistor R3 function as the power supply voltage detection circuit 232 and the current limiting circuit 233. The transistors Tr1 to Tr10, the resistors R1 to R2 and R4, and the capacitors C1 to C2 function, for example, as the power supply protection element control circuit 234.

For example, the transistors Tr1 to Tr11, Tr13 and Tr14 preferably switch to the ON state or the OFF state at a certain threshold voltage (conveniently, referred to as a voltage VT) between the voltage VDD and the voltage VSS. More specifically, when a voltage lower than the voltage VT is applied to the gate, the transistors Tr1 to Tr3, Tr7, and Tr9 go into the ON state, and when a voltage greater than the voltage VT is applied to the gate, the transistors Tr1 to Tr3, Tr7 and Tr9 go into the OFF state. When a voltage lower than the voltage VT is applied to the gate, the transistors Tr4 to Tr6, Tr8, Tr10, Tr11, Tr13, and Tr14 go into the OFF state, and when a voltage greater than the voltage VT is applied to the gate, the transistors Tr4 to Tr6, Tr8, Tr10, Tr11, Tr13, and Tr14 go into the ON state. As such, it is preferable that in the case where one of the transistors having the p channel polarity and the transistors having the n channel polarity is in the ON state, the other goes into the OFF state, and when one of the transistors is in the OFF state, the other goes into the ON state. In the following description, regarding a voltage applied to the gates of the transistors Tr1 to Tr13, a voltage lower than the voltage VT is referred to as an "L" level, and a voltage greater than the voltage VT is referred to as a "H" level. A state in which neither the "L" level nor the "H" level can be determined by applying a voltage in the vicinity of the voltage VT is also referred to as "indefinite".

The threshold voltage of the transistor Tr12 is set to be lower than the threshold voltages VT of the other transistors Tr1 to Tr3, Tr7 and Tr9. For that reason, the transistor Tr12 operates faster than these transistors.

The resistor R1 includes a first end connected to the pad P1 and a second end connected to a node VRC. The capacitor C1 includes a first end connected to pad P2 and a second end connected to the node VRC. The resistor R1 and the capacitor C1 function as a trigger circuit that operates based on a time constant determined based on the respective resistance and capacitance values. Specifically, the voltage of the node VRC follows voltage fluctuation of the pad P1 with a time delay based on the time constant. Such a trigger circuit is also called an RC timer.

The transistor Tr1 includes a first end connected to the pad P1, a second end connected to the first end of the transistor Tr3, and a gate connected to the node VRC. The transistor Tr2 includes a first end connected to the pad P1, a second end connected to the first end of the transistor Tr3, and a gate connected to a node VFB. The transistor Tr3 includes a second end connected to a node VSECOND and a gate connected to the node VRC.

The transistor Tr4 includes a first end connected to the pad P2, a second end connected to a first end of the transistor Tr6, and a gate connected to the node VRC. The transistor Tr5 includes a first end connected to the pad P2, a second end connected to the first end of the transistor Tr6, and a gate connected to the node VFB. The transistor Tr6 includes a second end connected to node VSECOND and a gate connected to the node VRC.

The transistors Tr1, Tr2, Tr4, and Tr5 provide a hysteresis function to the power supply protection circuit 23 to operate stably when the voltage VDD of the pad P1 fluctuates. The transistors Tr3 and Tr6 function as first stage inverters in a RCTMOS circuit which receives the voltage of the node VRC as an input and outputs a voltage having a logic level inverted from the input to the node VSECOND.

The transistor Tr7 includes a first end connected to the pad P1, a second end connected to the node VFB, and a gate connected to the node VSECOND. The transistor Tr8 includes a first end connected to pad P2, a second end connected to node VFB, and a gate connected to node VSECOND. The transistors Tr7 and Tr8 function as the second stage inverter in the RCTMOS circuit, which receives a voltage of the node VSECOND as an input, and output a voltage which has a logic level inverted from the input to the node VFB.

The resistor R2 includes a first end connected to the node VFB and a second end connected to the node VTHIRD. The capacitor C2 includes a first end connected to the pad P2 and a second end connected to the node VTHIRD. The resistor R2 and the capacitor C2 limit oscillation of a signal between the inverters in the power supply protection circuit 23.

The transistor Tr9 includes a first end connected to the pad P1, a second end connected to the node GIN, and a gate connected to the node VTHIRD. The transistor Tr10 includes a first end connected to the pad P2, a second end connected to the node GIN, and a gate connected to the node VTHIRD. The transistors Tr9 and Tr10 function as a third stage inverter in the RCTMOS circuit which receives the voltage of the node VTHIRD as an input and outputs a voltage having a logic level inverted from the input to the node GIN.

The sizes of respective inverters connected in series between the trigger circuit and the transistor Tr14 are designed in such a way that the second stage inverter is the smallest, the first stage inverter is the next smallest, and the third stage inverter is the largest. The size is, for example, a ratio (W/L) of a gate width W to a gate length L. The size may be regarded as a length of the gate width W when the gate length L is the same.

Specifically, for example, the size of the transistor Tr3 is larger than the size of the transistor Tr7 and is smaller than the size of the transistor Tr9. The size of the transistor Tr6 is larger than the size of the transistor Tr8 and is smaller than the size of the transistor Tr10.

The transistor Tr11 includes a first end connected to the pad P2, a second end connected to the first end of the resistor R3, and a gate connected to the node VPD. The resistor R3 includes a second end connected to the node GIN. The transistor Tr11 and the resistor R3 are connected in series between the pad P2 and the node GIN, but the order of connection is not limited to the example illustrated in in FIG. 3.

In a case where the pads P1 and P2 are electrically connected with each other through the transistor Tr9, the resistor R3, and the transistor Tr11, the voltage of the node GIN is pulled up to the "H" level by the voltage of the pad P1 or is pulled down to the "L" level by the voltage of the pad P2.

For example, the transistor Tr11 has impedance different from that of the transistor Tr9. With this, in a case where both the transistor Tr9 and the transistor Tr11 are in the ON state, for example, the voltage of the node GIN is determined based on a ratio of magnitude of the impedance of the transistor Tr9 and magnitude of the combined impedance of the resistor R3 and the transistor Tr11. For example, the transistor Tr9, the resistor R3, and the transistor Tr11 are designed in such a way that in a case where the voltage of the pad P1 is equal to or greater than a voltage Vlim1, the voltage of the node GIN has a magnitude allowing the transistor Tr14 to go into the ON state, and in a case where the voltage of the pad P1 is less than the voltage Vlim1, the voltage of the node GIN has a magnitude allowing the transistor Tr14 to go into the OFF state.

In the following description, a state where the voltage of the node GIN causes the transistor Tr14 to go into the ON state is also referred to as "a state where it is pulled up to the "H" level by the voltage of the pad P1", and a state where it goes into the OFF state is referred to as "a state where it is pulled down to the "L" level by the voltage of the pad P2". That is, the transistor Tr9, the resistor R3, and the transistor Tr11 are designed in such a way that in a case where the voltage of the pad P1 is equal to or greater than the voltage Vlim1, for example, the voltage of the node GIN is pulled up to the "H" level by the voltage of the pad P1 and in a case where the voltage of the pad P1 is lower than the voltage Vlim1, the voltage of the node GIN is pulled down to the "L" level by the voltage of the pad P2.

For example, the voltage Vlim1 is larger than a value of the voltage which is normally applied as the voltage VDD and is smaller than an upper limit value of the voltage permitted by a circuit in the semiconductor memory device 20 after the interface circuit 22. That is, the voltage Vlim1 is set as a threshold value for determining whether the power supply protection circuit 23 should allow the ON current $I_s$ to flow or not.

In the example of FIG. 3, for example, the impedance of the transistor Tr11 may be set small enough that the function of pulling up the transistor Tr11 is negligible in relation to the transistor Tr9. In this case, the voltage of the node GIN is determined by a magnitude relation in impedance between the transistor Tr9 and the resistor R3.

The transistor Tr12 includes a first end connected to the pad P1, a second end connected to the node VPD, and a gate connected to the node GIN. The transistor Tr13 includes a first end connected to the pad P2, a second end connected to the node VPD, and a gate connected to the node GIN. The transistors Tr12 and Tr13 function as an inverter which receives the voltage of the node GIN as an input and outputs a voltage having a logic level inverted from the input to the node VPD.

The resistor R4 includes a first end connected to pad P2 and a second end connected to node GIN. The resistor R4 is connected in parallel with the transistor Tr11 and the resistor R3 between the pad P2 and the node GIN. A resistance value of the resistor R4 is larger than that of the other resistors R1 to R3. The resistor R4 can pull down the voltage of the node GIN to the "L" level by the voltage of the pad P2 in a state where the node GIN is not electrically connected to the pad P1. On the other hand, as described above, the resistor R4 has a resistance value larger than that of the other resistors R1 to R3 and thus, in a state where the node GIN is electrically connected to the pad P1, the resistor R4 barely contributes to the effect of pulling down the voltage of the node GIN to the "L" level by the voltage of pad P2.

The transistor Tr14 includes a first end connected to the pad P1, a second end connected to the pad P2, and a gate connected to the node GIN. The transistor Tr14 goes into the ON state when the voltage of the pad P1 abruptly rises and allows the ON current $I_s$ to flow from the first end toward the second end and moderates the influence on the interface circuit 22 due to an abrupt change in the voltage of the pad P1. The size of the transistor Tr14 is larger than the sizes of the other transistors Tr1 to Tr13.

1.2 Regarding Operation of Power Supply Protection Circuit

Figure 4:
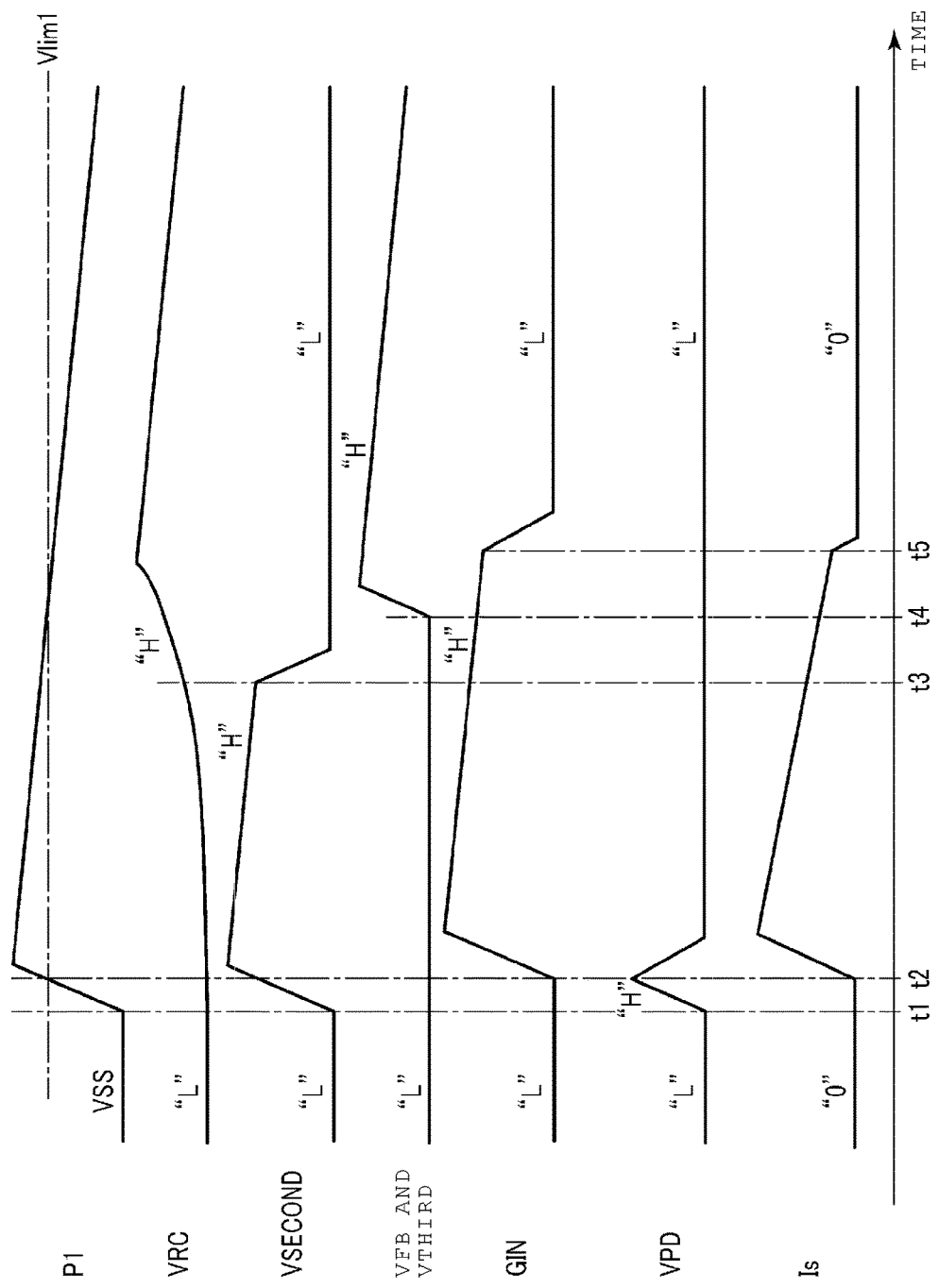
FIG. 4 is a timing chart for explaining an operation of the power supply protection circuit of the semiconductor memory device according to the first embodiment.
Figure 5:
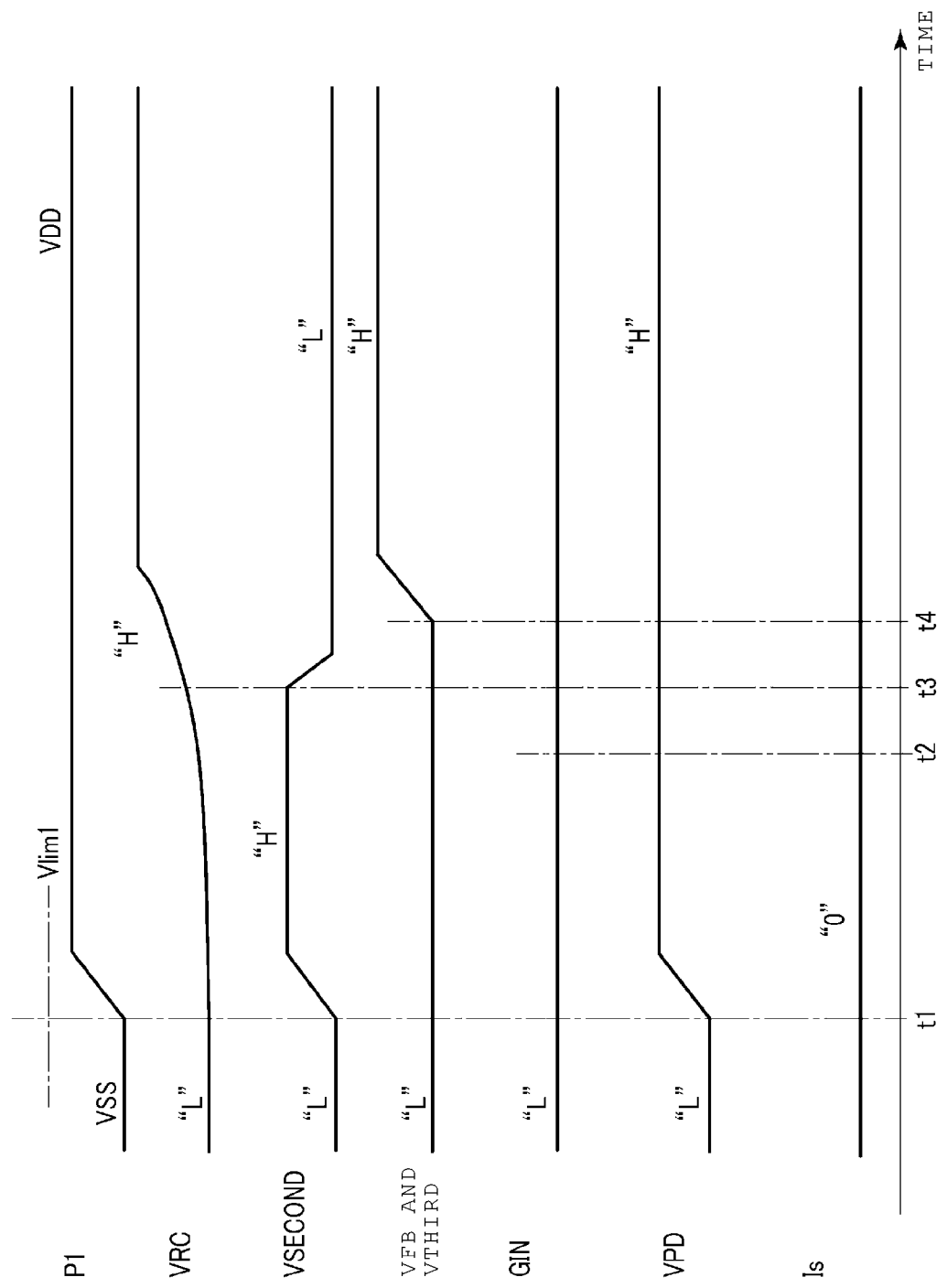
FIG. 5 is another timing chart for explaining the operation of the power supply protection circuit of the semiconductor memory device according to the first embodiment.

Next, the operation of the power supply protection circuit of the semiconductor memory device according to the first embodiment will be described using FIGS. 4 and 5. FIG. 4 illustrates the operation of the power supply protection circuit 23 when a surge is applied to the pad P1. FIG. 5 illustrates the operation of the power supply protection circuit 23 when a normal power supply voltage is applied to the pad P1.

1.2.1 Regarding Operation When Surge is Applied

First, the operation when a surge is applied to the pad P1 will be described.

As illustrated in FIG. 4, no voltage is supplied to the semiconductor memory device 20 until time t1. For that reason, the pads P1 and P2 become, for example, the voltage VSS. The node GIN is electrically connected to the pad P2 in advance through the resistor R4 and thus, the node GIN is preset to the voltage VSS ("L" level) of the pad P2 without becoming a floating state. For that reason, the transistor Tr14 goes into the OFF state, and the ON current $I_s$ does not flow.

At time t1, a surge is applied to the pad P1. Following this, the voltage of the pad P1 rapidly rises.

At the node VRC, the voltage gradually starts to rise as electric charges of the capacitor C1 are sufficiently charged. For that reason, the node VRC does not rise at the same time as the pad P1 and remains for a while at the "L" level. Following this, the transistors Tr1 and Tr3 go into the ON state and the transistors Tr4 and Tr6 go into the OFF state. The node VSECOND is electrically connected to the pad P1 and goes to the "H" level. Following this, the transistor Tr7 go into the OFF state and the transistor Tr8 go into the ON state. The node VTHIRD is electrically connected to the pad P2 and goes to the "L" level.

Here, as described above, the transistor Tr12 operates faster than the transistor Tr9. For that reason, as the voltage of the pad P1 rises, the transistor Tr12 go into the ON state before the transistor Tr9 go into the ON state, so that the node VPD goes to the "H" level. That is, before the node GIN is electrically connected to the pad P1 through the transistor Tr9, the node VPD is electrically connected to the pad P1 through the transistor Tr12 and causes the transistor Tr11 to go into the ON state. With this, the node GIN is electrically connected not only to the resistor R4 but also to the pad P2 through the transistor Tr11 and the resistor R3, and is maintained at the "L" level.

Also, until time t2 is reached, the voltage of the pad P1 does not reach the voltage Vlim even after the transistor Tr9 goes into the ON state. For that reason, the node GIN is pulled down to the "L" level by the voltage of the pad P2 based on the magnitude relationship between the impedance of the transistor Tr9 and the combined impedance of the resistor R3 and the transistor Tr11. Accordingly, the transistor Tr14 remains in the OFF state from time t1 to time t2.

At time t2, the voltage of the pad P1 reaches the voltage Vlim1. For that reason, the node GIN is pulled up to the "H" level by the voltage of pad P1. Following this, the transistors Tr12 and Tr13 go into the OFF state and the ON state, respectively, and the node VPD goes to the "L" level. The transistor Tr14 go into the ON state and the ON current $I_s$ starts to flow.

As such, the resistor R1 and the capacitor C1 function as a trigger circuit that causes the transistor Tr14 to go into the ON state by using the occurrence of a surge as a trigger. After the occurrence of the surge, the transistor Tr14 goes into the ON state for a certain period, so that the ON current $I_s$ flows from the pad P1 to the pad P2 by using the transistor Tr14 as a current path.

At time t3, when the voltage of the node VRC reaches the "H" level, the transistors Tr1 and Tr3 go into the OFF state and the transistors Tr4 and Tr6 go into the OFF state. Following this, the node VSECOND goes to the "L" level. A time difference occurs between the operation of the first stage inverter and the operation of the second stage inverter and thus, the voltages of the nodes VFB and VTHIRD remain "L" level at time t3.

At time t4, the transistor Tr7 goes into the ON state and the transistor Tr8 goes into the OFF state. Following this, the voltages of the nodes VFB and VTHIRD go into the "H" level. A time difference occurs between the operation of the second stage inverter and the operation of the third stage inverter and thus, the voltage of the node GIN remains at the "H" level at time t4.

At time t5, the transistor Tr9 goes into the OFF state and the transistor Tr10 goes into the ON state. Following this, the voltage of the node GIN goes into the "L" level. Following this, the transistor Tr14 goes into the OFF state and the ON current $I_s$ stops.

By doing as described above, the operation of the power supply protection circuit 23 when the surge is applied is ended.

1.2.2 Regarding Operation When Normal Power Supply Voltage is Applied

Next, an operation when a normal power supply voltage is applied to the pad P1 will be described. The time illustrated in FIG. 5 corresponds to the time illustrated in FIG. 4.

As illustrated in FIG. 5, since the operation up to time t1 is the same as in the case of FIG. 4, descriptions thereof will be omitted.

At time t1, the voltage VDD is applied to the pad P1. Following this, the voltage of the pad P1 gently rises, for example, reaches the voltage VDD. Other operations at time t1 are the same as in the case of FIG. 4, so that the description thereof will be omitted.

At time t2, the transistor Tr9 starts to operate, so that the node GIN is also electrically connected to the pad P1 through the transistor Tr9. As described above, although the voltage of the pad P1 has reached the voltage VDD, the voltage has not yet reached the voltage Vlim1, so that the node GIN is pulled down to the "L" level by the voltage of the pad P2. Following this, the node VPD is maintained at the "H" level. The transistor Tr14 is maintained in the OFF state and the ON current $I_s$ does not flow.

Operations at times t3 and t4 are the same as in FIG. 4, except that the nodes VPD and GIN are maintained at the "H" level and the "L" level, respectively, and no ON current $I_s$ flows, so that the description thereof will be omitted.

By doing as described above, the operation of the power supply protection circuit 23 when a normal power supply voltage is applied to the pad P1 is ended.

1.3 Effects According to the Present Embodiment

According to the first embodiment, it is possible to reduce the through current flowing when power is turned on. This effect will be described below.

The RCTMOS circuit is configured to forcibly short-circuit the power supply and the ground when ESD stress occurs. On the other hand, the RCTMOS circuit may function even when the power supply is turned on and accordingly, there is a possibility that a through current flows unintentionally in the power supply protection circuit.

According to the first embodiment, the transistors Tr9 and Tr11 are connected in series between the pads P1 and P2, and are connected so that the intermediate node thereof becomes the node GIN. With this, in a case where both the transistors Tr9 and Tr11 go into the ON state, the voltage of the node GIN is pulled up to the "H" level by the voltage of the pad P1 or pulled down to the "L" level by the voltage of the pad P2. Whether the voltage of the node GIN is to be pulled to the voltage of the pad P1 or the pad P2 is determined depending on whether or not the voltage of the pad P1 exceeds the voltage Vlim1, and the magnitude of the voltage Vlim1 is determined by the magnitude relation in impedance between the transistors Tr9 and Tr11. For that reason, by setting the impedances of the transistors Tr9 and Tr11 so as to be different from each other, the voltage of the node GIN can be pulled down to the "L" level until the voltage of the pad P1 reaches the voltage Vlim1, and when the voltage reaches the voltage Vlim1, the voltage of the node GIN can be pulled up to the "H "Level. Accordingly, by setting the voltage Vlim1 to be a value larger than the voltage VDD when power is turned on, it is possible to prevent the ON current $I_s$ from flowing when power is turned on and also, reduce the through current flowing when power is turned on.

In order to function as the RCTMOS circuit, the transistors Tr9 and Tr10 are set to have the same impedance. For that reason, one (e.g., transistor Tr10) of the transistors Tr10 and Tr11 has the same impedance as that of the transistor Tr9, and the other (e.g., transistor Tr11) has the impedance different from that of the transistor Tr9. That is, the transistors Tr10 and Tr11 have different impedances. Here, the transistors Tr10 and Tr11 have the same polarity and thus, the transistors Tr10 and Tr11 can have different sizes. Accordingly, in order to set the impedances of the transistors Tr9 and Tr11 so as to be different from each other, the sizes of the transistors Tr10 and Tr11 are set to be different.

Further, the resistor R3 is connected in series between the node GIN and the transistor Tr11. With this, accuracy of the voltage Vlim1 can be improved. In other words, the polarities of the channels of the transistors Tr9 and Tr11 are different from each other. For that reason, the magnitude of the voltage Vlim1 can largely fluctuate due to the manufacturing error of the transistors Tr9 and Tr11. On the other hand, in general, the manufacturing error of the resistor is smaller than the manufacturing error of the transistor. For that reason, in the first embodiment, by providing the resistor R3, the magnitude of the voltage Vlim1 is determined by the magnitude relationship between the impedance of the transistor Tr9 and the impedances of the resistor R3 and the transistor Tr11. In this case, the impedance of the transistor Tr11 is set to a small value so that the pull-down effect by the transistor Tr11 is maximized. With this, the magnitude of the voltage Vlim1 can be substantially determined based on the magnitude relationship between the impedance of the transistor Tr9 and the impedance of the resistor R3. For that reason, it is possible to reduce the influence that the voltage Vlim1 fluctuates due to the manufacturing error of the transistor Tr11. For that reason, it is possible to more accurately reduce the through current flowing when power is turned on.

Further, the threshold voltage of the transistor Tr12 is set to be lower than that of the transistor Tr9. With this, the transistor Tr12 can operate faster than the transistor Tr9. For that reason, the transistor Tr12 can supply the voltage of the pad P1 to the node VPD before the transistor Tr9 go into the ON state to supply the voltage of the pad P1 to the node GIN. Accordingly, it is possible to ensure that the voltage of the node GIN is pulled down to the "L" level before the voltage of the node GIN goes into the "H" level by the voltage of the pad P1.

Further, the resistor R4 electrically connects the pad P2 and the node GIN. With this, the resistor R4 can be pulled down to the "L" level by the voltage of the pad P2 without bringing the node GIN into a floating state in a state where the node GIN is not electrically connected to the pad P1. Further, the resistor R4 has a high resistance. With this, in a state where the node GIN is electrically connected to the pad P1, the voltage of the node GIN will not be pulled down to the "L" level by the voltage of the pad P2. For that reason, it is possible to stabilize the voltage of the node GIN without influencing the operation of the RCTMOS circuit.

2. Second Embodiment

Next, a semiconductor memory device according to a second embodiment will be described. The power supply protection circuit in the semiconductor memory device according to the first embodiment is configured to detect the voltage Vlim1 and limit the ON current $I_s$ at the node GIN between the third stage inverter and the transistor Tr14. On the other hand, the power supply protection circuit in the semiconductor memory device according to the second embodiment is configured to detect the voltage Vlim1 and limit the ON current $I_s$ at the node VSECOND between the first stage inverter and the second stage inverter. In the following, the same components as those of the first embodiment are denoted by the same reference numerals, the explanation thereof will be omitted, and only the portions different from the first embodiment will be described.

2.1 Regarding Configuration of Power Supply Protection Circuit

Figure 6:
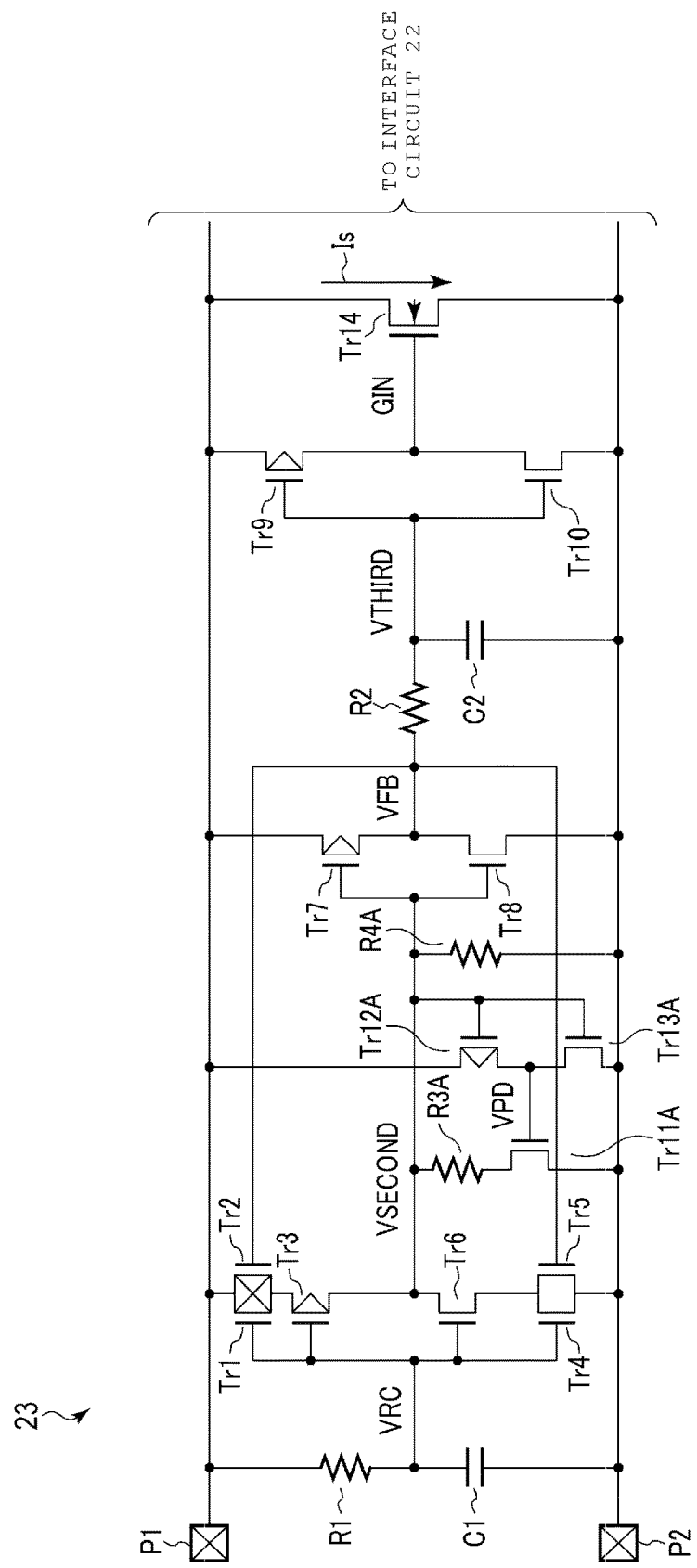
FIG. 6 is a circuit diagram of a power supply protection circuit of a semiconductor memory device system according to a second embodiment.

The configuration of the power supply protection circuit of the semiconductor memory device according to the second embodiment will be described using FIG. 6. FIG. 6 corresponds to FIG. 3 in the first embodiment.

As illustrated in FIG. 6, the power supply protection circuit 23 includes transistors Tr11A, Tr12A and Tr13A and resistors R3A and R4A, instead of the transistors Tr11, Tr12 and Tr13 and the resistors R3 and R4 in FIG. 3. The transistor Tr12A has, for example, the p channel polarity. The transistors Tr11A and Tr13A have, for example, the n channel polarity.

The transistor Tr11A includes a first end connected to the pad P2, a second end connected to the first end of the resistor R3A, and a gate connected to the node VPD. The resistor R3A includes a second end connected to the node VSECOND. The transistor Tr11A and the resistor R3A are connected in series between the pad P2 and the node VSECOND, but the order of connection is not limited to the example illustrated in FIG. 6.

In a case where the pads P1 and P2 are electrically connected with each other through the transistors Tr1 and Tr3, the resistor R3A, and the transistor Tr11A, the voltage of the node VSECOND is pulled up to the "H" level by the voltage of the pad P1 or is pulled down to the "L" level by the voltage of pad P2.

The transistor Tr11A has a size different from, for example, that of the transistors Tr1 and Tr3. With this, the transistors Tr1 and Tr3, the resistor R3A, and the transistor Tr11A pull up the voltage of the node VSECOND to the "H" level by the voltage of the pad P1 in a case where the voltage of the pad P1 is equal to or greater than the voltage Vlim1, and pull down the voltage of the node VSECOND to the "L" level by the voltage of the pad P2 in a case where the voltage of the pad P1 is less than the voltage Vlim1.

In the example of FIG. 6, for example, the impedance of the transistor Tr11A may be set small enough that the function of pulling up the transistors Tr1 and Tr3 is negligible in relation to the transistor Tr11A. In this case, the voltage of the node VSECOND is determined by the magnitude relation in impedance between the transistors Tr1 and Tr3 and the resistor R3A.

The transistor Tr12A includes a first end connected to the pad P1, a second end connected to the node VPD, and a gate connected to the node VSECOND. The transistor Tr13A includes a first end connected to the pad P2, a second end connected to the node VPD, and a gate connected to the node VSECOND. The transistors Tr12A and Tr13A function as an inverter which receives the voltage of the node VSECOND as an input and outputs a voltage having a logic level inverted from the input to the node VPD.

The resistor R4A includes a first end connected to the pad P2 and a second end connected to the node VSECOND. The resistor R4A is connected in parallel with the transistor Tr11A and the resistor R3A between the pad P2 and the node VSECOND. The resistance value of the resistor R4A is larger than that of the other resistances R1 to R3. The resistor R4A can pull down the voltage of the node VSECOND to the "L" level by the voltage of the pad P2 in a state where the node VSECOND is not electrically connected to the pad P1. On the other hand, as described above, the resistor R4A has a resistance value larger than that of the other resistors R1 to R3 and thus, in a state where the node VSECOND is electrically connected to the pad P1, the resistor R4A barely contributes to the effect of pulling down the voltage of the node VSECOND to the "L" level by the voltage of the pad P2.

The threshold voltage of the transistor Tr12A is set to be lower than the threshold voltages VT of the other transistors Tr1 to Tr3, Tr7 and Tr9. For that reason, the transistor Tr12A operates faster than these transistors.

2.2 Regarding Configuration of Power Supply Protection Circuit

Figure 7:
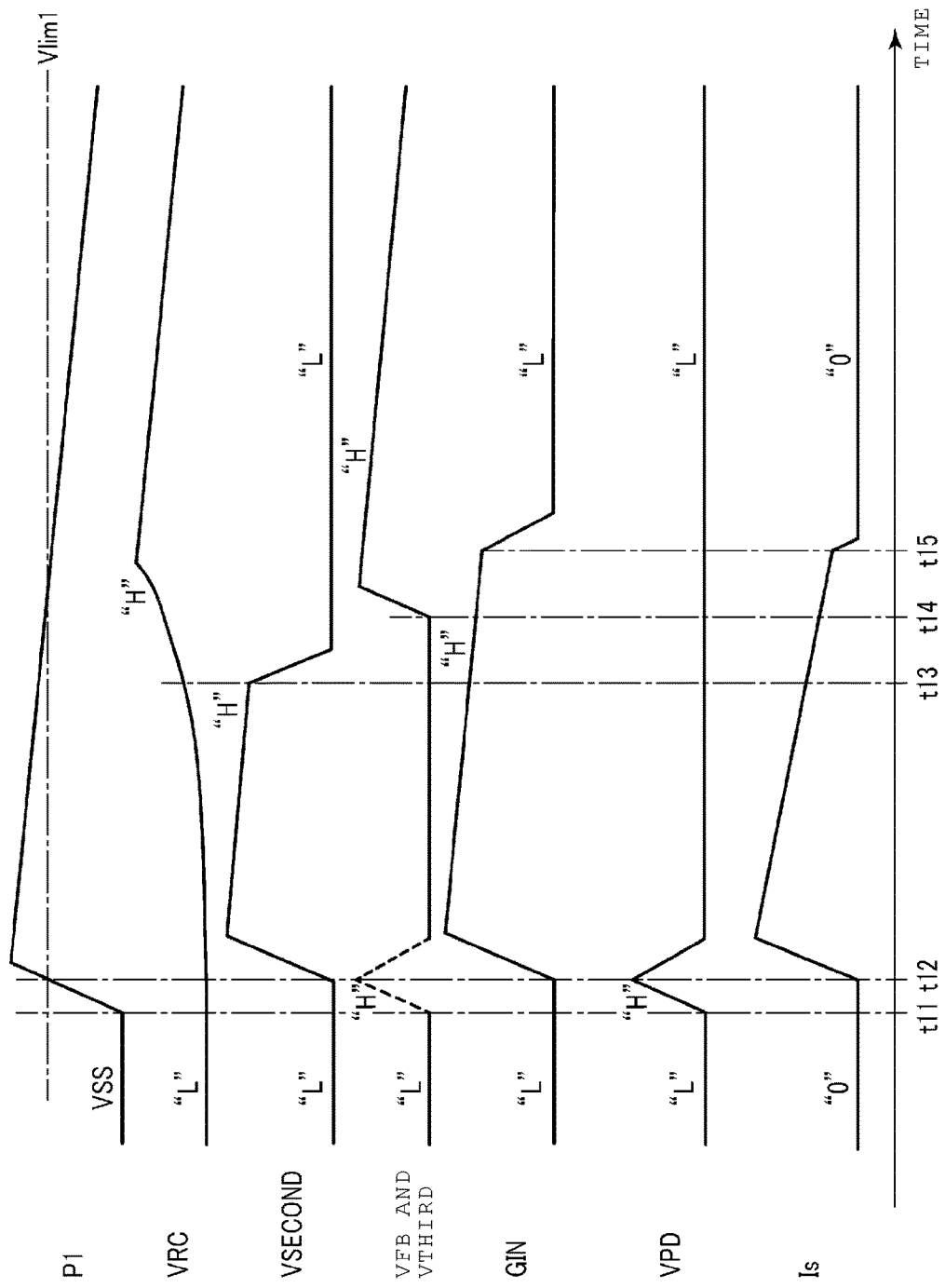
FIG. 7 is a timing chart for explaining an operation of the power supply protection circuit of the semiconductor memory device according to the second embodiment.

Next, the operation of the power supply protection circuit of the semiconductor memory device according to the second embodiment will be described using FIG. 7. FIG. 7 corresponds to FIG. 4 in the first embodiment. That is, FIG. 7 illustrates the operation of the power supply protection circuit 23 when a surge is applied.

As illustrated in FIG. 7, no voltage is supplied to the semiconductor memory device 20 until time t11. For that reason, the voltage of the pads P1 and P2 becomes, for example, the voltage VSS. The node VSECOND is electrically connected to the pad P2 in advance through the resistor R4A and thus, the node VSECOND is preset to the voltage VSS ("L" level) of the pad P2 without becoming a floating state.

At time t11, a surge is applied to the pad P1. Following this, the voltage of the pad P1 rapidly rises.

At the node VRC, the voltage starts to gradually rise as charges of the capacitor C1 are sufficiently charged. For that reason, the node VRC does not rise at the same time as the pad P1 and remains for a while at the "L" level.

Here, as described above, the transistor Tr12A operates faster than the transistors Tr1 and Tr3. For that reason, as the voltage of the pad P1 rises, the transistor Tr12A goes into the ON state and the node VPD goes to the "H" level, before the transistors Tr1 and Tr3 go into the ON state. That is, before the node VSECOND is electrically connected to the pad P1 through the transistors Tr1 and Tr3, the node VPD is electrically connected to the pad P1 through the transistor Tr12A and the transistor Tr11A becomes the ON state. With this, the node VSECOND is electrically connected not only to the resistor R4A but also to the pad P2 through the transistor Tr11A and the resistor R3A, and is kept at the "L" level.

Also, until time t12 is reached, the voltage of the pad P1 does not reach the voltage Vlim even after the transistors Tr1 and Tr3 go into the ON state. For that reason, the node VSECOND is pulled down to the "L" level by the voltage of the pad P2 based on the magnitude relationship between the combined impedance of the transistors Tr1 and Tr3 and the combined impedance of the resistor R3A and the transistor Tr11A.

Following this, the transistors Tr7 and Tr8 go into the ON state and the OFF state, respectively, and the node VTHIRD goes to the "H" level. The voltage of the pad P1 does not rise sufficiently during a period from time t11 to time t12 and thus, the node VTHIRD can be indefinite.

At time t12, the voltage of the pad P1 reaches the voltage Vlim1. For that reason, node VSECOND is pulled up to the "H" level by the voltage of pad P1. Following this, the transistors Tr12A and Tr13A go into the OFF state and the ON state, respectively, and the node VPD goes to the "L" level. In addition, the transistor Tr7 goes into the OFF state and the transistor Tr8 goes into the ON state.

The node VTHIRD is electrically connected to the pad P2 and goes to the "L" level. Following this, the transistor Tr9 goes into the ON state and the transistor Tr10 goes into the OFF state.

The node GIN is electrically connected to the pad P1 and goes to the "H" level. Accordingly, the transistor Tr14 goes into the ON state and the ON current $I_s$ starts to flow.

The operation after time t13 is the same as the operation after time t3 illustrated in FIG. 4.

That is, when the voltage of node VRC reaches the "H" level at time t13, the transistors Tr1 and Tr3 go into the OFF state, and transistors Tr4 and Tr6 go into the ON state. Following this, the node VSECOND goes to the "L" level.

At time t14, the transistor Tr7 goes into the ON state and the transistor Tr8 goes into the OFF state. Following this, the voltages of the nodes VFB and VTHIRD go to the "H" level.

At time t15, the transistor Tr9 goes into the OFF state and the transistor Tr10 goes into the ON state. Following this, the voltage of the node GIN goes to the "L" level. Following this, the transistor Tr14 goes into the OFF state and the ON current $I_s$ stops.

By doing as described above, the operation of the power supply protection circuit 23 when the surge is applied is ended.

2.3 Regarding Effects of Present Embodiment

In general, the RCTMOS circuit is designed so that the size of the transistor Tr14 is increased in order for the ON current $I_s$ to reliably flow. For that reason, a size of the inverter at the third stage (final stage) of the RCTMOS circuit is generally the largest. That is, in a case where the sizes of the transistors Tr3 and Tr9 are compared, the size of the transistor Tr3 is smaller one.

According to the second embodiment, the transistors Tr11A to Tr13A and the resistors R3A and R4A are provided between the first stage inverter and the second stage inverter of the RCTMOS circuit. With this, the magnitude of the voltage Vlim1 is determined by the relationship between the resistor R3A, the transistor Tr11A, and the transistor Tr3. As described above, the size of the transistor Tr3 is smaller than the size of the transistor Tr9. With this, the resistor R3A and the transistor Tr11A can be provided with a size smaller than those of the resistor R3 and the transistor Tr11 in the first embodiment. For that reason, a circuit area of the power supply protection circuit 23 can be further reduced, and the transistor Tr11A can be driven with smaller power.

3. Third Embodiment

Next, a semiconductor memory device according to a third embodiment will be described. The power supply protection circuit in the semiconductor memory device according to the first embodiment and the second embodiment has a configuration in which three stages of inverters are connected in series between the trigger circuit and the transistor Tr14. On the other hand, in the power supply protection circuit in the semiconductor memory device according to the third embodiment, five stages of inverters are connected in series between the trigger circuit and the transistor Tr14. In the following, the same components as those of the first embodiment are denoted by the same reference numerals, the explanation thereof will be omitted, and only the portions different from those of the first embodiment will be described.

3.1 Regarding Configuration of Power Supply Protection Circuit

Figure 8:
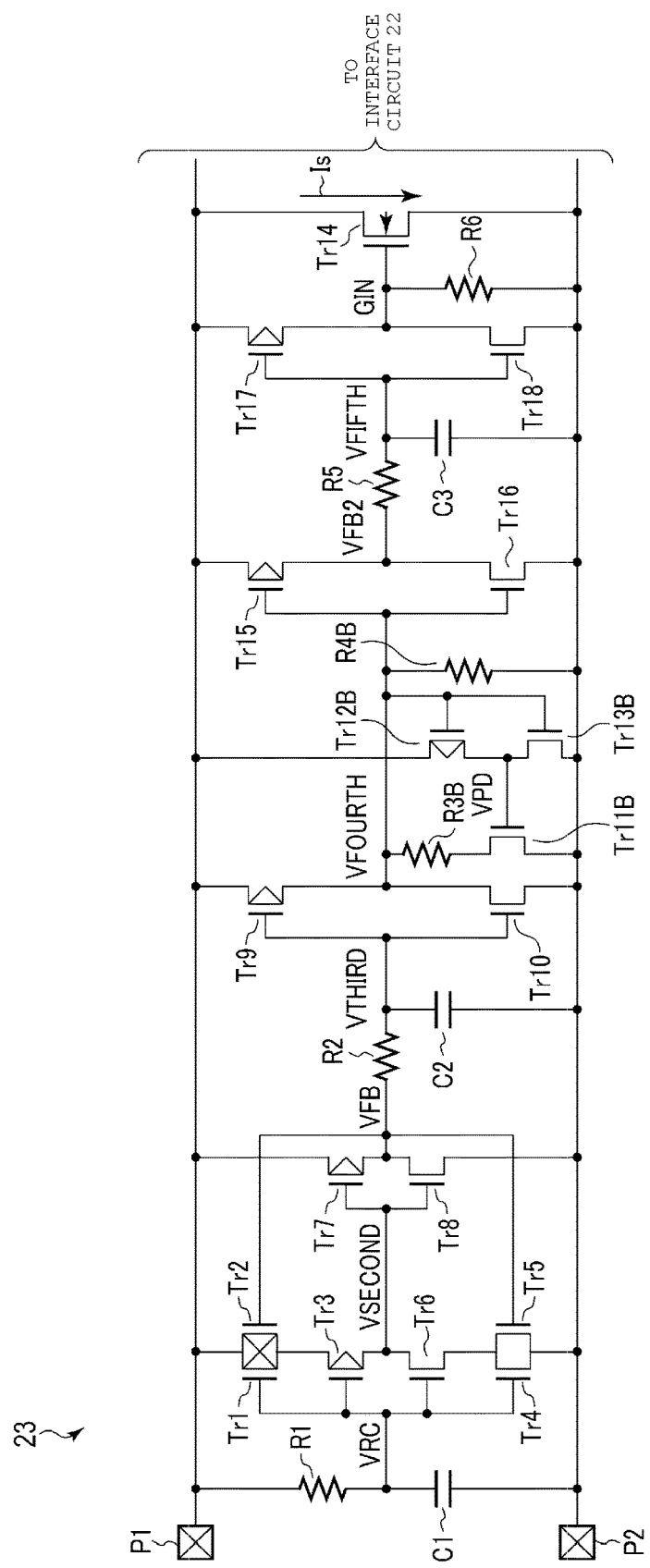
FIG. 8 is a circuit diagram of a power supply protection circuit of a semiconductor memory device system according to a third embodiment.

A configuration of the power supply protection circuit of the semiconductor memory device according to the third embodiment will be described using FIG. 8. FIG. 8 corresponds to FIG. 3 in the first embodiment.

As illustrated in FIG. 8, the power supply protection circuit 23 includes transistors Tr11B, Tr12B, and Tr13B and resistors R3B and R4B, instead of the transistors Tr11, Tr12, and Tr13 and the resistors R3 and R4 in FIG. 3. In addition, the power supply protection circuit 23 further includes transistors Tr15, Tr16, Tr17, and Tr18, resistors R5 and R6, and a capacitor C3. The transistors Tr12B, Tr15, and Tr17 have, for example, the p channel polarity. For example, the transistors Tr11B, Tr13B, Tr16, and Tr18 have the n channel polarity.

The transistor Tr9 includes a first end connected to the pad P1, a second end connected to the node VFOURTH, and a gate connected to the node VTHIRD. The transistor Tr10 includes a first end connected to the pad P2, a second end connected to the node VFOURTH, and a gate connected to the node VTHIRD. The transistors Tr9 and Tr10 function as a third stage inverter in the RCTMOS circuit which receives the voltage of the node VTHIRD as an input and outputs a voltage having a logic level inverted from the input to the node VFOURTH.

The transistor Tr15 includes a first end connected to the pad P1, a second end connected to the node VFB2, and a gate connected to the node VFOURTH. The transistor Tr16 includes a first end connected to the pad P2, a second end connected to the node VFB2, and a gate connected to the node VFOURTH. The transistors Tr15 and Tr16 function as a fourth stage inverter in the RCTMOS circuit which receives the voltage of the node VFOURTH as an input and outputs a voltage having a logic level inverted from the input to the node VFB2.

The resistor R5 includes a first end connected to the node VFB2 and a second end connected to the node VFIFTH. The capacitor C3 includes a first end connected to the pad P2 and a second end connected to the node VFIFTH. The resistor R5 and the capacitor C3 limit oscillation of the signal between the inverters in the power supply protection circuit 23.

The transistor Tr17 includes a first end connected to the pad P1, a second end connected to the node GIN, and a gate connected to the node VFIFTH. The transistor Tr18 includes a first end connected to the pad P2, a second end connected to the node GIN, and a gate connected to the node VFIFTH. The transistors Tr17 and Tr18 function as a fifth stage inverter in the RCTMOS circuit which receives the voltage of the node VFIFTH as an input and outputs a voltage having a logic level inverted from the input to the node GIN.

The sizes of respective inverters connected in series between the trigger circuit and the transistor Tr14 are designed in such a way that the size becomes larger in the order of the second stage inverter, and the first stage inverter, the third stage inverter, the fourth stage inverter, and the fifth stage inverter.

The transistor Tr11B includes a first end connected to the pad P2, a second end connected to the first end of the resistor R3B, and a gate connected to the node VPD. The resistor R3B includes a second end connected to node VFOURTH. The transistors Tr11B and the resistor R3B are connected in series between the pad P2 and the node VFOURTH, but the order of connection is not limited to the example illustrated in FIG. 8.

In a case where the pads P1 and P2 are electrically connected with each other through the transistor Tr9, the resistor R3B and the transistor Tr11B, the voltage of the node VFOURTH is pulled up to the "H" level by the voltage of the pad P1 or is pulled down to the "L" level by the voltage of the pad P2.

The size of the transistor Tr11B is different from, for example, that of the transistor Tr9. With this, the transistor Tr9, the resistor R3B, and the transistor Tr11B pull up the voltage of the node VFOURTH to the "H" level by the voltage of the pad P1 in a case where the voltage of the pad P1 is equal to or greater than the voltage Vlim1, for example, and pull down the voltage of the node VFOURTH to the "L" level by the voltage of the pad P2 in a case where the voltage of the pad P1 is less than the voltage Vlim1.

In the example of FIG. 8, for example, the size of the transistor Tr11B may be set small enough that the function of pulling up the transistor Tr9 is negligible in relation to the transistor Tr11B. In this case, the voltage of the node VFOURTH is determined by the magnitude relationship in impedance between the transistor Tr9 and the resistor R3B.

The transistor Tr12B includes a first end connected to the pad P1, a second end connected to the node VPD, and a gate connected to the node VFOURTH. The transistor Tr13B includes a first end connected to the pad P2, a second end connected to the node VPD, and a gate connected to the node VFOURTH. The transistors Tr12B and Tr13B function as an inverter which receives the voltage of the node VFOURTH as an input and outputs a voltage having a logic level inverted from the input to the node VPD.

The threshold voltage of the transistor Tr12B is set lower than those of the other transistors Tr1 to Tr3, Tr7, Tr9, Tr15, and Tr17. For that reason, the transistor Tr12B operates faster than these transistors.

The resistor R4B includes a first end connected to the pad P2 and a second end connected to the node VFOURTH. The resistor R4B is connected in parallel with the transistor Tr11B and the resistor R3B between the pad P2 and the node VFOURTH. The resistor R6 includes a first end connected to pad P2 and a second end connected to the node GIN. Resistance values of the resistors R4B and R6 are larger than those of the other resistors R1 to R3 and R5.

The resistors R4B and R6 can pull down the voltages of the nodes VFOURTH and GIN to the "L" level by the voltage of the pad P2 in a state where the nodes VFOURTH and GIN are not electrically connected to the pad P1, respectively. On the other hand, as described above, the resistors R4B and R6 have resistance values greater than those of the other resistors R1 to R3 and R5 and thus, in a state where the nodes VFOURTH and GIN are electrically connected to the pad P1, the resistors R4B and R6 barely contribute to the effect of pulling down the voltages of the nodes VFOURTH and GIN to the "L" level by the voltage of the pad P2.

3.2 Regarding Operation of Power Supply Protection Circuit

Figure 9:
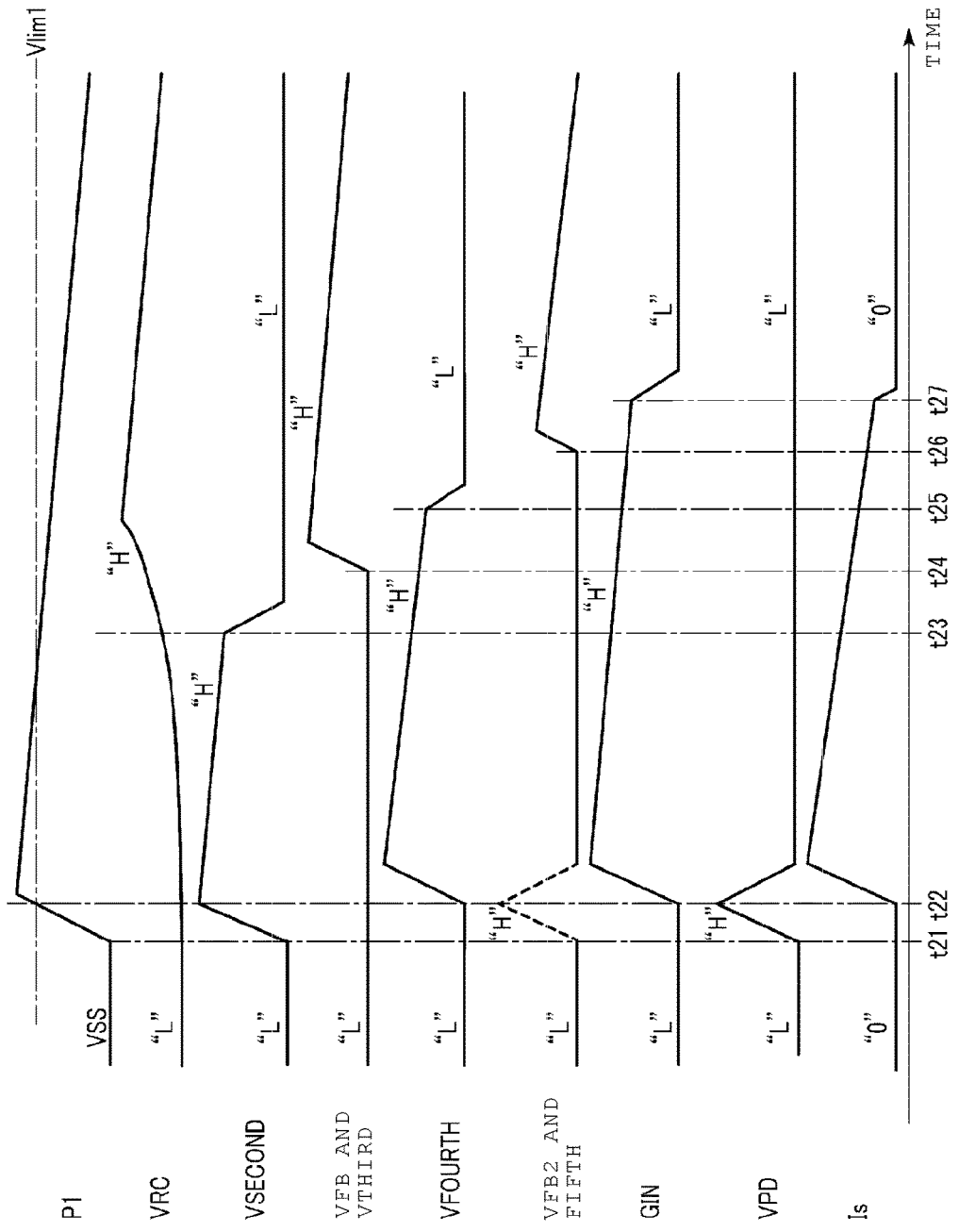
FIG. 9 is a timing chart for explaining an operation of the power supply protection circuit of the semiconductor memory device according to the third embodiment.

Next, the operation of the power supply protection circuit of the semiconductor memory device according to the third embodiment will be described using FIG. 9. FIG. 9 corresponds to FIG. 4 in the first embodiment. That is, FIG. 9 illustrates the operation of the power supply protection circuit 23 when the surge is applied.

As illustrated in FIG. 9, no voltage is supplied to the semiconductor memory device 20 until time t21 is reached. For that reason, the voltages of the pads P1 and P2 become, for example, the voltage VSS. The nodes VFOURTH and GIN are electrically connected to the pad P2 in advance through the resistors R4B and R6, respectively, and thus the nodes VFOURTH and GIN are preset to the voltage VSS ("L" level) of the pad P2 without becoming the floating state.

At time t21, a surge is applied to the pad P1. Following this, the voltage of the pad P1 rapidly rises.

At the node VRC, the voltage starts to gradually rise as charges of the capacitor C1 are sufficiently charged. For that reason, the node VRC does not rise at the same time as the pad P1 and remains for a while at the "L" level. Following this, the transistors Tr1 and Tr3 go into the ON state and the transistors Tr4 and Tr6 go into the OFF state. The node VSECOND is electrically connected to the pad P1 and goes to the "H" level. Following this, the transistor Tr7 goes into the OFF state and the transistor Tr8 goes into the ON state. The node VTHIRD is electrically connected to the pad P2 and goes to the "L" level.

Here, as described above, the transistor Tr12B operates faster than the transistor Tr9. For that reason, as the voltage of the pad P1 rises, the transistor Tr12B goes into the ON state and the node VPD goes to the "H" level before the transistor Tr9 goes into the ON state. That is, before the node VFOURTH is electrically connected to the pad P1 through the transistor Tr9, the node VPD is electrically connected to the pad P1 through the transistor Tr12B and the transistor Tr11B goes into the ON state. With this, the node VFOURTH is electrically connected not only to the resistor R4B but also to the pad P2 through the transistor Tr11B and the resistor R3B, and is maintained at the "L" level. The transistors Tr15 to 18 do not operate at high speed like the transistor Tr9 and thus, the nodes VFIFTH and GIN are not electrically connected to the pad P1 at time t21. For that reason, the nodes VFIFTH and GIN are maintained at the "L" level.

Also, until the time t22 is reached, the voltage of the pad P1 does not reach the voltage Vlim even after the transistor Tr9 goes into the ON state. For that reason, the node VFOURTH is pulled down to the "L" level by the voltage of the pad P2 based on the magnitude relationship between the impedance of the transistor Tr9 and the combined impedance of the resistor R3B and the transistor Tr11B.

Following this, the transistors Tr15 and Tr16 go into the OFF state and the ON state, respectively, and the node VFIFTH goes to the "H" level. The voltage of the pad P1 is not sufficiently increased during a period from the time t21 to the time t22 and thus, the node VFIFTH can become undefined.

At time t22, the voltage of the pad P1 reaches the voltage Vlim1. For that reason, node VFOURTH is pulled up to the "H" level by the voltage of the pad P1. Following this, the transistors Tr12B and Tr13B go into the OFF state and the ON state, respectively, and the node VPD goes to the "L" level. Further, the transistor Tr15 goes into the OFF state and the transistor Tr16 goes into the ON state.

When the transistor Tr16 go into the ON state, the node VFIFTH is electrically connected to the pad P2, and then goes to the "L" level. When the transistor Tr17 go into the ON state, the node GIN is electrically connected to the pad P1 through the transistor Tr17 and goes to the "H" level. Following this, the transistor Tr14 goes into the ON state and the ON current $I_s$ starts to flow.

The operation at a period from the time t23 to the time t24 is the same as the operation after the time t3 illustrated in FIG. 4.

That is, when the voltage of the node VRC reaches the "H" level at time t23, the transistors Tr1 and Tr3 go into the OFF state and the transistors Tr4 and Tr6 go into the OFF state. Following this, the node VSECOND goes to the "L" level.

At time t24, the transistor Tr7 goes into the ON state and the transistor Tr8 goes into the OFF state. Following this, the voltages of the nodes VFB and VTHIRD go the "H" level.

At time t25, the transistor Tr9 goes into the OFF state and the transistor Tr10 goes into the ON state. Following this, the voltage of the node VFOURTH goes to the "L" level.

At time t26, the transistor Tr15 goes into the ON state and the transistor Tr16 goes into the OFF state. Accordingly, the voltages of the nodes VFB2 and VFIFTH go to the "H" level.

At time t27, the transistor Tr17 goes into the OFF state and the transistor Tr18 goes into the ON state. Following this, the transistor Tr14 goes into the OFF state and the ON current $I_s$ stops.

By doing as described above, the operation of the power supply protection circuit 23 when the surge is applied is ended.

3.3 Regarding Effects of Present Embodiment

According to the third embodiment, the RCTMOS circuit is configured with inverters of five stages. As described above, the size of the inverter at the fifth stage (final stage) of the RCTMOS circuit is the largest. On the other hand, in order to convert the gentle waveform generated by the RC timer into a steep waveform, the size of the first stage inverter is larger than the size of the inverter at a middle stage (third stage). That is, in a case where the sizes of the transistors Tr3, Tr9 and Tr17 are compared with each other, the size of the transistor Tr9 is smaller than the sizes of the transistors Tr3 and Tr17.

According to the third embodiment, the transistors Tr11B to Tr13B and the resistors R3B and R4B are provided between the third stage inverter and the fourth stage inverter of the RCTMOS circuit. With this, the magnitude of the voltage Vlim1 is determined by the magnitude relationship in impedance between the resistor R3B and the transistor Tr11B, and the transistor Tr9. For that reason, the transistor Tr11B can be provided with a smaller size than a case where the voltage Vlim1 is determined based on the magnitude relationship in impedance with transistors (for example, transistor Tr3 or Tr17) in the inverters at the other stages. For that reason, the circuit area of the power supply protection circuit 23 can be further reduced and the transistor Tr11B can be driven with smaller power.

4. Modification Example

The semiconductor memory device according to each of the embodiments described above is not limited to the example described above and various modification examples may be applied thereto. In each of the modification examples to be described below, a case where the modification example is applied to any of the above-described embodiments is illustrated as an example. However, each of the modification examples to be described below is not limited to any of the above-described embodiments, and can be similarly applied to other embodiments, and the same effect can be obtained.

4.1 First Modification Example

In the example illustrated in the third embodiment, the case where in the power supply protection circuit 23, the ON current $I_s$ stops at a point in time when the voltage of the node GIN became the "L" level at time t27 was described. However, the power supply protection circuit 23 is not limited to the above example, and the power supply protection circuit 23 may have a configuration that allows the ON current $I_s$ to flow even after time t27. In the following description, description on the same functional configuration as in the third embodiment will be omitted, and description will be mainly made on different functional configurations.

Figure 10:
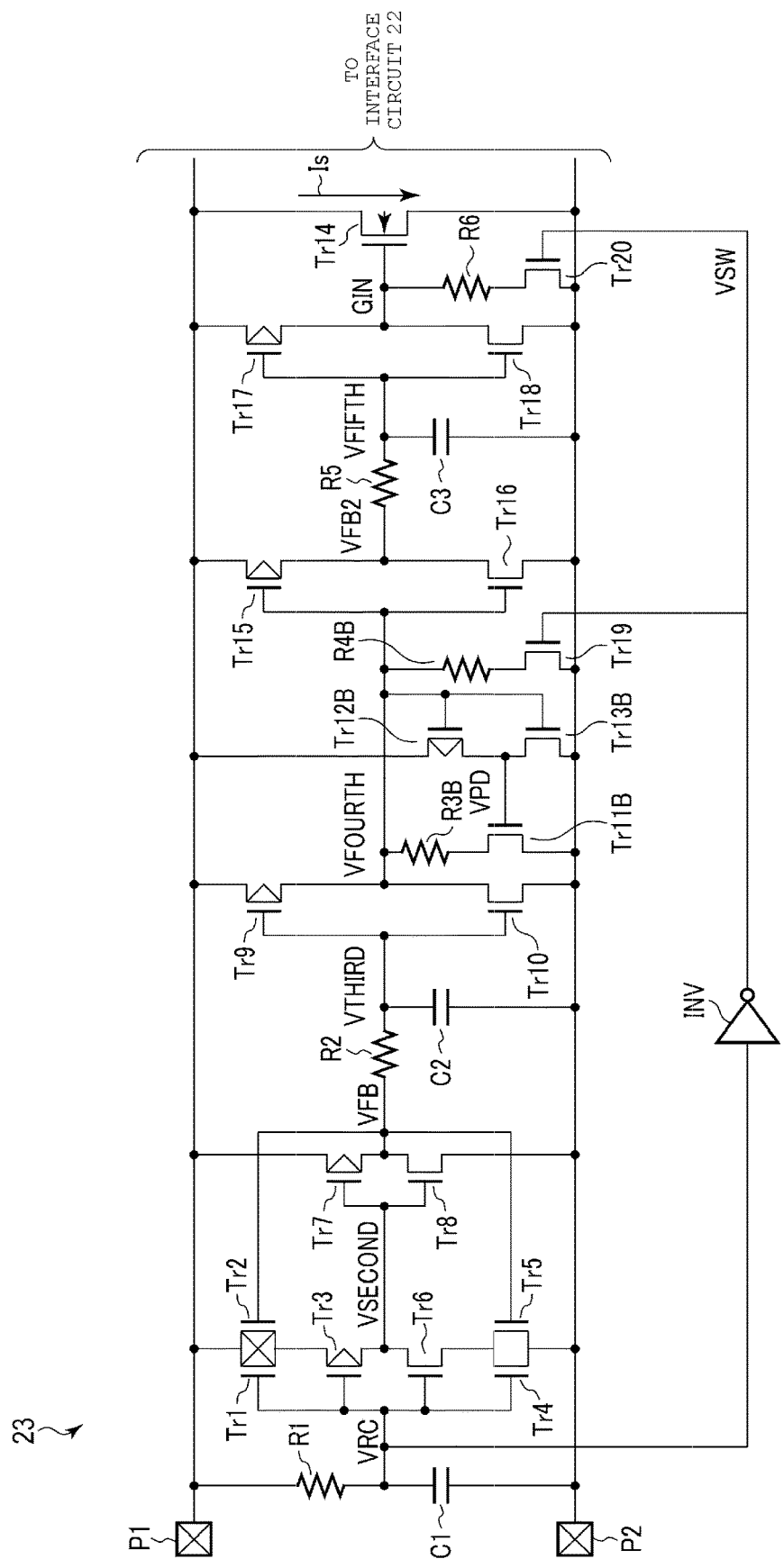
FIG. 10 is a circuit diagram of a power supply protection circuit of a semiconductor memory device system according to a first modification example.

FIG. 10 is a circuit diagram for explaining the configuration of the power supply protection circuit of the semiconductor memory device according to the first modification example. FIG. 10 corresponds to FIG. 8 described in the third embodiment. As illustrated in FIG. 10, the power supply protection circuit 23 may further include transistors Tr19 and Tr20 and an inverter INV.

The transistor Tr19 includes a first end connected to the pad P2, a second end connected to a first end of the resistor R4B, and a gate connected to a node VSW. The transistor Tr20 includes a first end connected to the pad P2, a second end connected to the first end of the resistor R5, and a gate connected to the node VSW. The inverter INV includes an input end connected to the node VRC and an output end connected to the node VSW. The transistors Tr19 and Tr20 have, for example, the n channel polarity.

The transistors Tr19 and Tr20 each of which functions as a switch for turning ON and OFF the function of pulling down the nodes VFOURTH and GIN to the "L" level by the pad P2. The inverter INV functions as a trigger for switching ON and OFF of the switch function of the transistors Tr19 and Tr20. The transistor Tr19 and the resistor R4B, and the transistor Tr20 and the resistor R6 are connected in series between the pad P2 and the node VFOURTH, and between the pad P2 and the node GIN, respectively, but the order of connection thereof is not limited to the example of FIG. 10.

Figure 11:
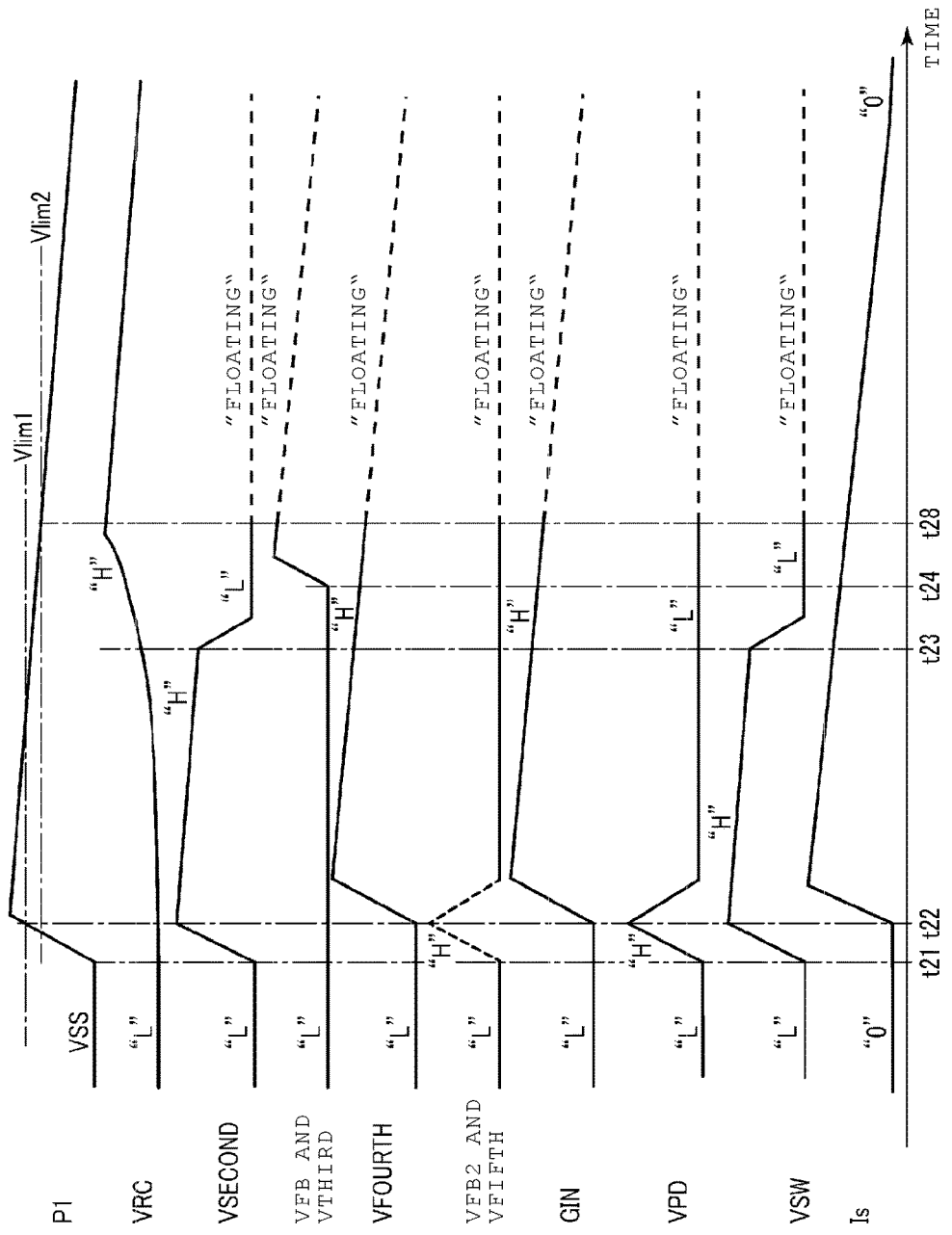
FIG. 11 is a timing chart for explaining an operation of the power supply protection circuit of the semiconductor memory device according to the first modification example.

FIG. 11 is a timing chart for explaining the operation of the power supply protection circuit of the semiconductor memory device according to the first modification example. FIG. 11 corresponds to FIG. 9 described in the third embodiment. In the example of FIG. 11, a case where the voltage of the pad P1 reaches the voltage Vlim2 at a certain time t28 after time t24 will be described. The voltage Vlim2 is a lower limit value of the voltage with which the transistors Tr1 to Tr10, Tr11B to Tr13B, and Tr15 to Tr18 in the power supply protection circuit 23 can operate. In the following, description will be mainly made on an operation different from that in FIG. 9.

As illustrated in FIG. 11, at time t21, as the node VRC resides at the "L" level, the "L" level is input to the inverter INV. For that reason, the inverter INV outputs the "H" level to the node VSW. The transistors Tr19 and Tr20 go into the ON state and the nodes VFOURTH and GIN are electrically connected to the pad P2. With this, the nodes VFOURTH and GIN are maintained at the "L" level in the same way as in the example of FIG. 9 during a period from time t21 to time t22.

At time t28, as the voltage of the pad P1 drops to the voltage Vlim2, operations of the transistors Tr1 to Tr10, Tr11B to Tr13B, and Tr15 to Tr18 becomes impossible and all go into the OFF state. For that reason, all of the nodes VSECOND, VFB and VTHIRD, VFOURTH, VFB2 and VFIFTH, GIN, VPD, and VSW become the floating state. The node GIN goes to the floating state from the "H" level state. For this reason, the transistor Tr14 can be maintained at the ON state continuously from and after time t28 and can continue to keep the ON current $I_s$ flowing.

By doing as described above, the operation of the power supply protection circuit 23 when the surge is applied is ended.

Figure 12:
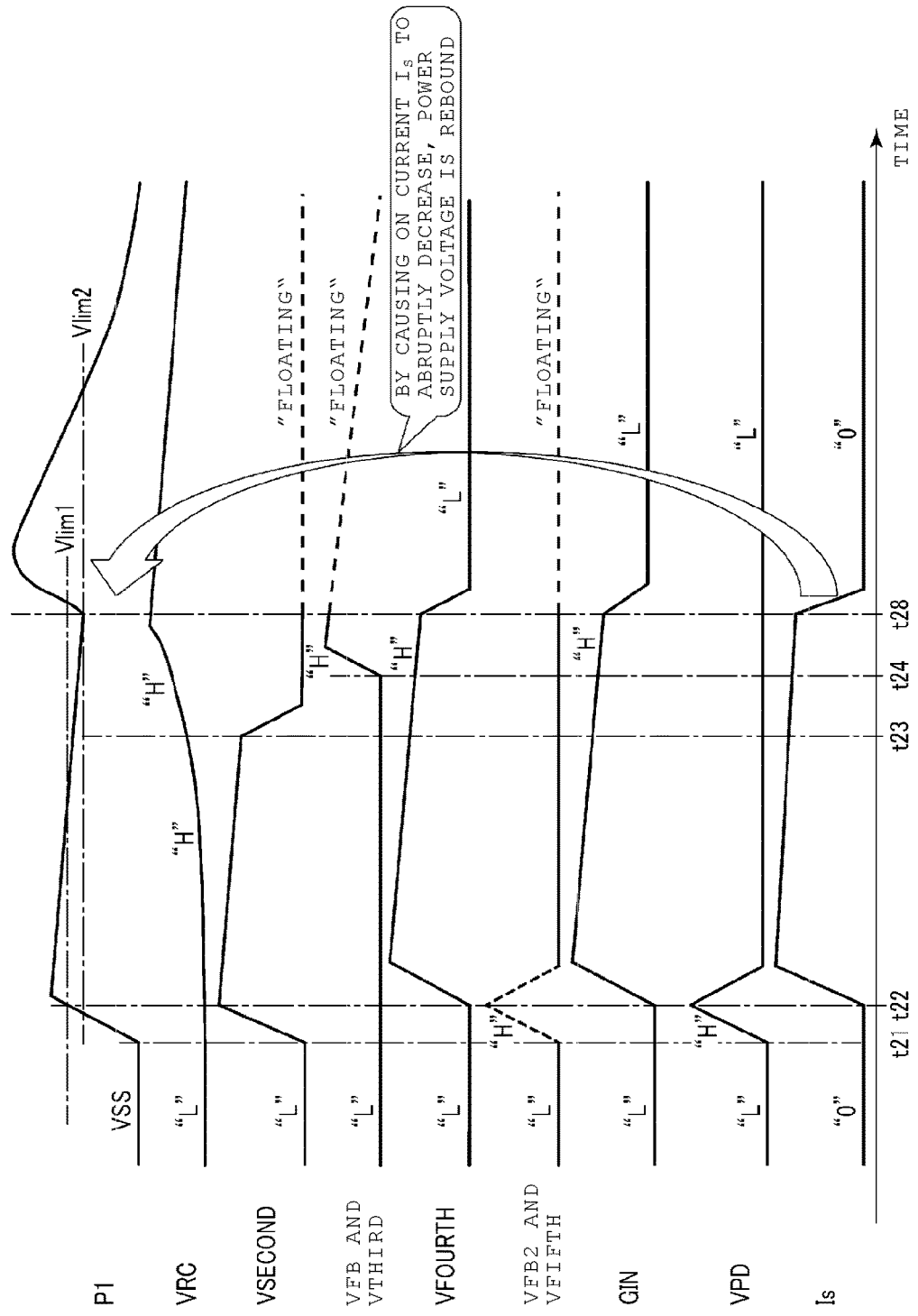
FIG. 12 is a timing chart for explaining an operation of a power supply protection circuit of a semiconductor memory device according to a comparative example.

The effects of the present modification example will be described using FIG. 12. FIG. 12 is a timing chart for explaining the operation of a power supply protection circuit according to a comparative example. FIG. 12 corresponds to FIG. 9 described in the third embodiment. In FIG. 12, a case where the ON current $I_s$ suddenly decreases at time t28 due to a fact that much ON current $I_s$ is still flowing is illustrated.

As illustrated in FIG. 12, at time t28, the node GIN is electrically disconnected from the pad P1, so that the node GIN is pulled down to the "L" level by the voltage of the pad P2 through the resistor R6. For that reason, the transistor Tr14 go into the OFF state and the ON current $I_s$ abruptly decreases. In such a case, the current path of the ON current $I_s$ from the pad P1 to the pad P2 is cut off and thus, the voltage of the pad P1 can be rebound. Increasing of the voltage of the pad P1 due to the rebound is undesirable because it can increase a possibility of damaging an internal circuit after the interface circuit 22.

According to the present modification example, the transistors Tr19 and Tr20 disconnect the nodes VFOURTH and GIN from the pad P2 at time t23. With this, at time t28, the nodes VFOURTH and GIN are prevented from being pulled down to the "L" level by pad P2. For that reason, the transistor Tr14 can maintain the ON state even after the voltage of the pad P1 becomes lower than the voltage Vlim2. For that reason, it is possible to limit rapid decrease of the ON current $I_s$, and eventually to protect the circuit in the semiconductor memory device 20 from the surge.

Each of the gates of the transistors Tr19 and Tr20 is connected to an output end of the inverter INV. For that reason, at time t21, the transistors Tr19 and Tr20 can go into the ON state. With this, immediately after occurrence of the surge, the nodes VFOURTH and GIN can be maintained at the "L" level without becoming the floating state. For that reason, it is possible to prevent the transistor Tr14 from becoming the ON state inadvertently, and eventually, it is possible to appropriately protect the circuit in the semiconductor memory device 20.

The node VSW and the node VRC are connected through one inverter INV. On the other hand, the nodes VFOURTH and GIN and the node VRC are connected through more than one inverter INV. That is, a signal based on the node VRC is transmitted to the node VSW at a higher speed than the nodes VFOURTH and GIN. For that reason, the voltage of the node VSW can ensure the transistors Tr19 and Tr20 are switched to the OFF state at time t23 (before time t28 is reached) while setting the transistors Tr19 and Tr20 to the ON state immediately after the occurrence of the surge.

Further, the inverter INV is connected to the node VRC. With this, the inverter INV can operate without preparing a new RC timer. For that reason, an increase in the circuit area can be prevented.

4.2 Second Modification Example

In each of the embodiments described above, the case where the magnitude of the voltage Vlim1 is determined according to the magnitude relationship between the impedance of one transistor and the combined impedance of one resistor and one transistor is described, but is not limited thereto. For example, the magnitude of the voltage Vlim1 may be determined according to the magnitude relationship between the combined impedance of one transistor and one resistor and the combined impedance of one resistor and one transistor. In the following description, description of the same functional configuration as in the third embodiment will be omitted, and description will be mainly made on different functional configurations.

Figure 13:
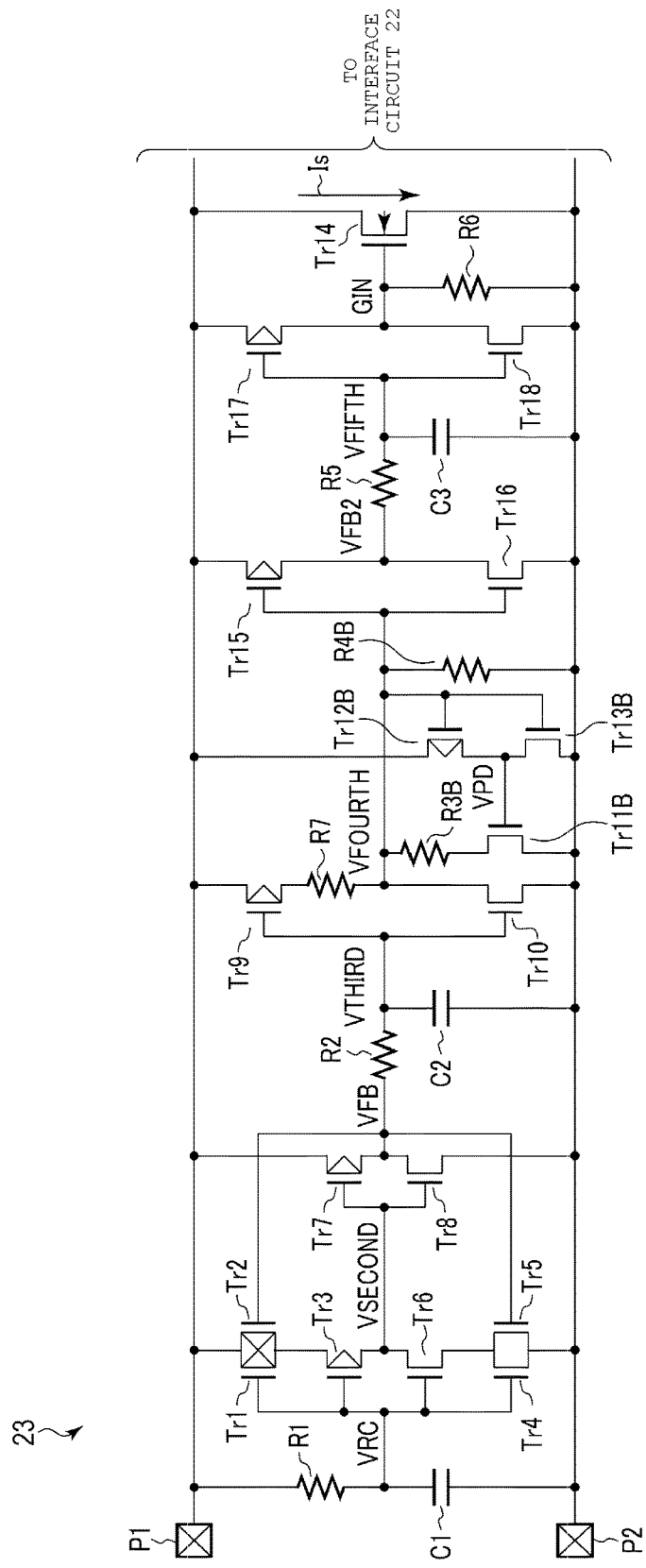
FIG. 13 is a circuit diagram of a power supply protection circuit of a semiconductor memory device system according to a second modification example.

FIG. 13 is a circuit diagram for explaining a configuration of a power supply protection circuit of a semiconductor memory device according to a second modification example. FIG. 13 corresponds to FIG. 8 described in the third embodiment. As illustrated in FIG. 13, the power supply protection circuit 23 may further include a resistor R7.

The second end of the transistor Tr9 is connected to the first end of the resistor R7. The second end of the resistor R7 is connected to the node VFOURTH. The resistor R7 compensates for a manufacturing error of the resistor R3B and has a resistance value different from that of the resistor R3B. The transistor Tr9 and the resistor R7 are connected in series between the pad P1 and the node VFOURTH, but the order of connection is not limited to the example illustrated in FIG. 13.

Effects obtained by the configuration described above will be described below.

The resistor 3B may have variation due to the manufacturing error. For that reason, the voltage Vlim1 can fluctuate in accordance with the manufacturing error that the resistor 3B has.

In the second modification example, the transistor Tr11B and the resistor R3B are provided between the node VFOURTH and the pad P2, while the transistor Tr9 and the resistor R7 are provided between the node VFOURTH and the pad P1. The resistors R3B and R7 are provided, for example, in the same manufacturing process and thus, in a case where the manufacturing error occurs in the resistor R3B, a similar manufacturing error occurs in the resistor R7.

For that reason, in the magnitude relationship between the combined impedance between the node VFOURTH and the pad P1 and the combined impedance between the node VFOURTH and the pad P2, the manufacturing error occurring in the resistor R3B and the manufacturing error occurring in the resistor R7 are offset. For that reason, the voltage Vlim1 can be determined more accurately.

4.3 Third Modification Example

In each of the embodiments described above, the case where the transistors Tr11 to Tr13 and the resistors R3 and R4 are provided between the intermediate node and the pad P2 is described, but the invention is not limited thereto. For example, the transistors Tr11 to Tr13 and the resistors R3 and R4 may be provided between the intermediate node and the pad P1. In the following description, description of the same functional configuration as that of the first embodiment will be omitted and description will be mainly made on different functional configurations.

Figure 14:
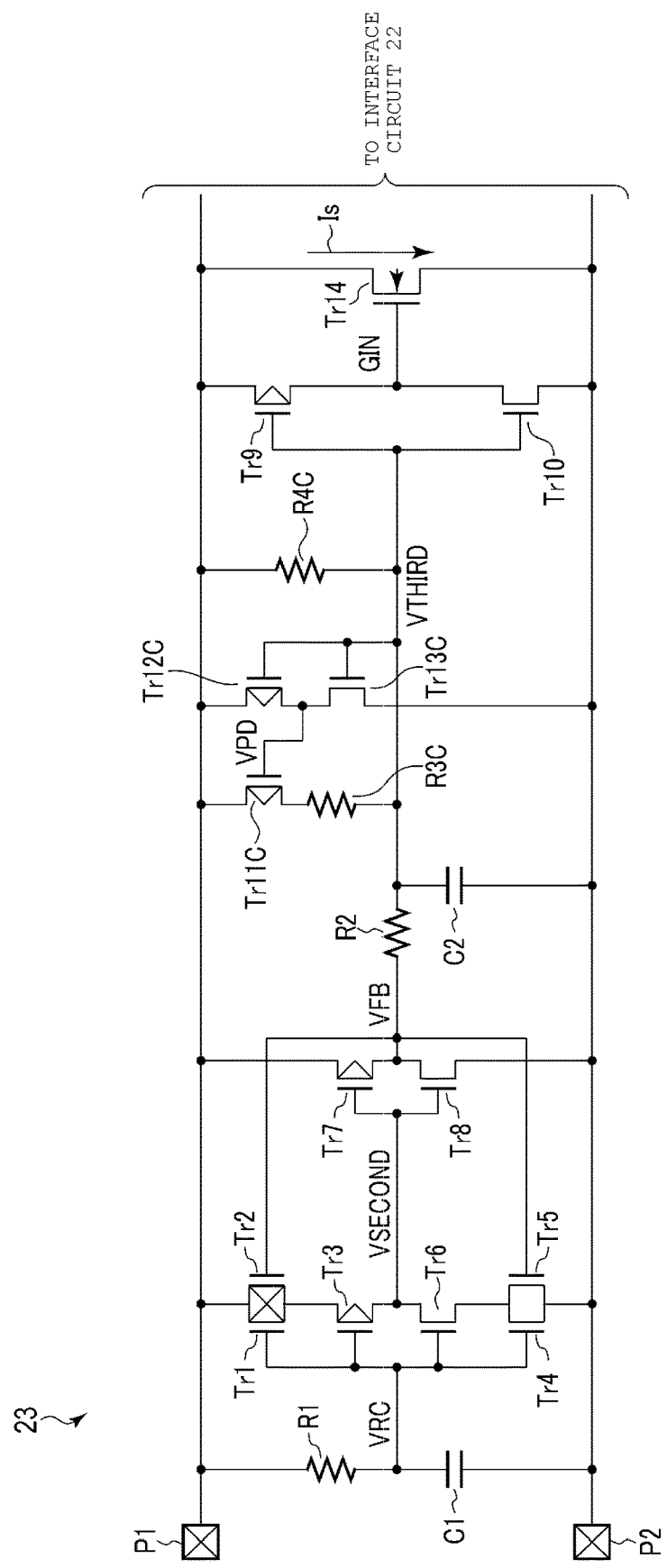
FIG. 14 is a circuit diagram of a power supply protection circuit of a semiconductor memory device system according to a third modification example.

FIG. 14 is a circuit diagram for explaining a configuration of a power supply protection circuit of a semiconductor memory device according to a third modification example. As illustrated in FIG. 14, the power supply protection circuit 23 includes transistors Tr11C to Tr13C and resistors R3C and R4C, instead of the transistors Tr11 to Tr13 and the resistors R3 and R4. The transistors Tr11C and Tr12C have, for example, the p channel polarity. The transistor Tr13 C has, for example, the n channel polarity.

The transistor Tr11C includes a first end connected to the pad P1, a second end connected to the first end of the resistor R3C, and a gate connected to the node VPD. The resistor R3C includes a second end connected to the node VTHIRD. The transistor Tr11C and the resistor R3C are connected in series between the pad P1 and the node VTHIRD, but the order of connection is not limited to the example illustrated in FIG. 14.

In a case where the pads P1 and P2 are electrically connected with each other through the transistor Tr11C, the resistor R3C, and the transistor Tr8, the voltage of the node VTHIRD is pulled up to the "H" level by the voltage of the pad P1 or is pulled down to the "L" level by the voltage of the pad P2.

The size of the transistor Tr11C is different from, for example, that of the transistor Tr8. With this, transistor Tr11C, the resistor R3C, and the transistor Tr8 are designed in such a way that in a case where, for example, the voltage of the pad P1 is equal to or greater than the voltage Vlim1, the voltage of the node VTHIRD is pulled down to the "L" level by the voltage of the pad P2 and in a case where the voltage of the pad P1 is less than the voltage Vlim1, the voltage of the node VTHIRD is pulled up to the "H" level by the voltage of the pad P1.

In the example of FIG. 14, for example, the size of the transistor Tr11C may be set small enough that the function of pulling down the transistor Tr8 is negligible in relation to the transistor Tr11C. In this case, the voltage of the node VTHIRD is determined by the impedance relationship between the transistor Tr8 and the resistor R3C.

The transistor Tr12C includes a first end connected to the pad P1, a second end connected to the node VPD, and a gate connected to the node VTHIRD. The transistor Tr13C includes a first end connected to the pad P2, a second end connected to the node VPD, and a gate at the node VTHIRD. The transistors Tr12C and Tr13C function as an inverter that receives the voltage of the node VTHIRD as an input and outputs a voltage having a logic level inverted from the input to the node VPD.

The resistor R4C includes a first end connected to the pad P1 and a second end connected to the node VTHIRD. The resistor R4C is connected in parallel with the transistor Tr11C and the resistor R3C between the pad P1 and the node VTHIRD. The resistance value of the resistor R4C is larger than that of the other resistors R1, R2, and R3C. The resistor R4C can pull up the voltage of the node VTHIRD to the "H" level by the voltage of the pad P1 in a state where the node VTHIRD is not electrically connected to the pad P2. On the other hand, as described above, the resistor R4C has the resistance value larger than that of the other resistors R1, R2, and R3C and thus, in a state where the node VTHIRD is electrically connected to the pad P2, the resistor R4C barely contributes to the effect of pulling up the voltage of the node VTHIRD to the "H" level by the voltage of the pad P1.

The threshold voltage of the transistor Tr13C is set to be lower than that of the other transistors Tr4 to Tr6, Tr8 and Tr10. For that reason, the transistor Tr13C operates faster than these transistors.

Figure 15:
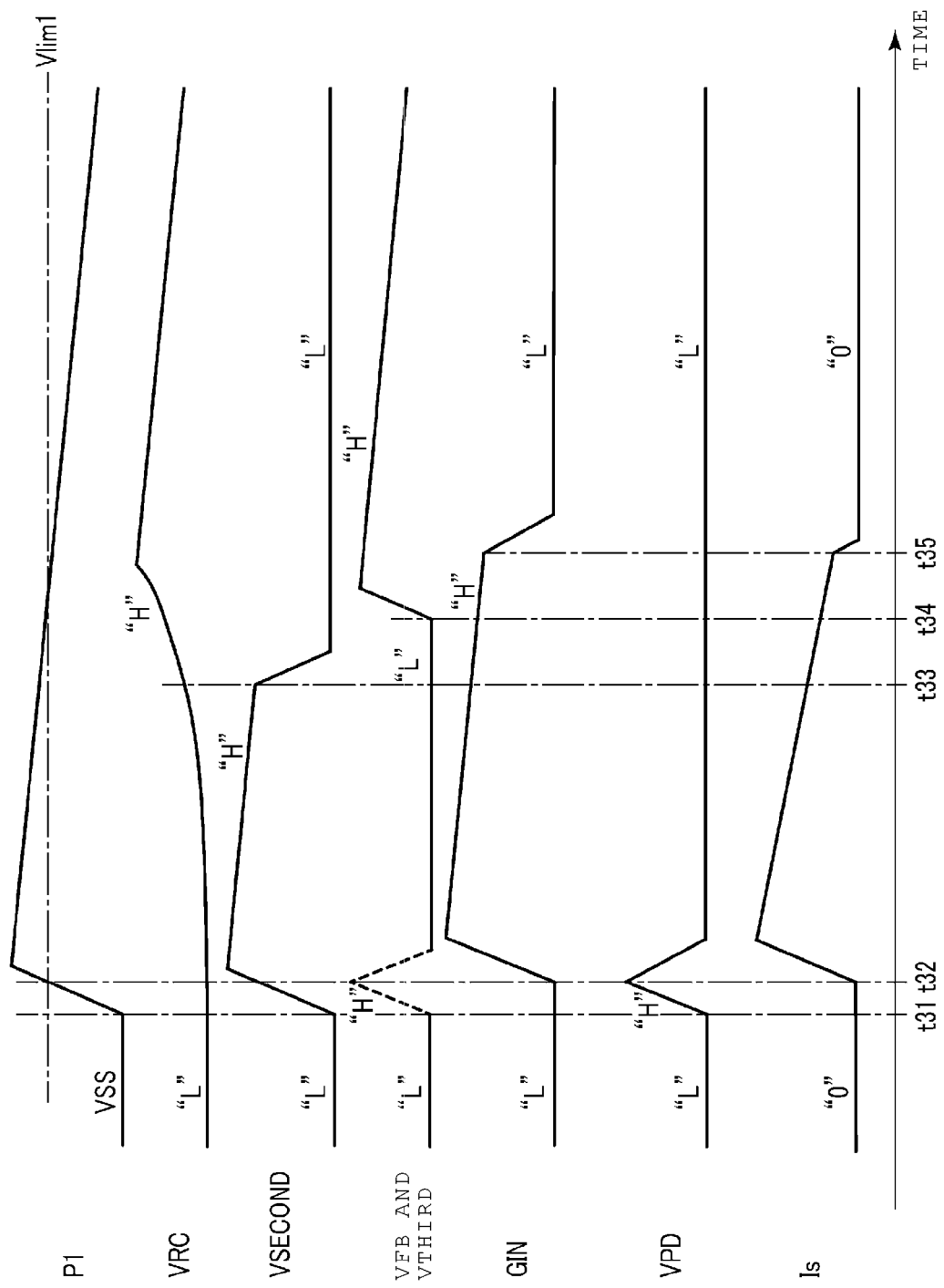
FIG. 15 is a timing chart for explaining an operation of the power supply protection circuit of the semiconductor memory device according to the third modification example.

FIG. 15 is a timing chart illustrating the operation of the power supply protection circuit of the semiconductor memory device according to the third modification example. FIG. 15 corresponds to FIG. 4 described in the first embodiment.

As illustrated in FIG. 15, a surge is applied to the pad P1 at time t31. Following this, the voltage of the pad P1 rapidly rises.

At the node VRC, the voltage starts to gradually rise as charges of the capacitor C1 are sufficiently charged. For that reason, the node VRC does not rise at the same time as the pad P1 and remains for a while at the "L" level. Following this, the transistors Tr1 and Tr3 go into the ON state, and the transistors Tr4 and Tr6 go into the OFF state. The node VSECOND is electrically connected to the pad P1 and goes to the "H" level.

Here, as described above, the transistor Tr13C operates at a higher speed than the transistor Tr8. For that reason, as the voltage of the pad P1 rises, the transistor Tr13C goes into the ON state and the node VPD goes to the "H" level, before the transistor Tr8 goes into the ON state. That is, before the node VTHIRD is electrically connected to the pad P2 through the transistor Tr8, the node VPD is electrically connected to the pad P2 through the transistor Tr13C and causes the transistor Tr11C to go into the ON state. With this, the node VTHIRD is electrically connected not only to the resistor R4 C but also to the pad P1 through the transistor Tr11C and the resistor R3C, and goes to the "H" level.

Until the time t32 is reached, the voltage of the pad P1 does not reach the voltage Vlim even after the transistor Tr8 goes into the ON state. For that reason, the node VTHIRD is pulled up to the "H" level by the voltage of the pad P1 based on the magnitude relationship between the impedance of the transistor Tr8 and the combined impedance of the resistor R3C and the transistor Tr11C. The voltage of the pad P1 does not rise sufficiently during a period from the time t31 to the time t32 and thus, the node VTHIRD can be indefinite. In any case, the transistor Tr9 remains at the OFF state during the period from time t31 to time t32.

At time t32, the voltage of the pad P1 reaches the voltage Vlim1. For that reason, the node VTHIRD is pulled down to the "L" level by the voltage of the pad P2. Following this, the transistors Tr12C and Tr13C go into the ON state and the OFF state, respectively, and the node VPD goes to the "H" level. The transistors Tr9 and Tr10 go into the ON state and the OFF state, respectively, and the node GIN goes to the "H" level. Following this, the ON current $I_s$ starts to flow.

When the voltage of node VRC reaches "H" level at time t33, the transistors Tr1 and Tr3 go into the OFF state and the transistors Tr4 and Tr6 go into the ON state. Following this, the node VSECOND goes to the "L" level. The time difference occurs between the operation of the first stage inverter and the operation of the second stage inverter and thus, at time t33, the voltages of the nodes VFB and VTHIRD remain at the "L" level.

At time t34, the transistor Tr7 goes into the ON state and the transistor Tr8 goes into the OFF state. Following this, the voltages of the nodes VFB and VTHIRD go to the "H" level. The transistors Tr12C and Tr13C go into the OFF state and the ON state, respectively, and the node VPD goes to the "L" level. The time difference occurs between the operation of the inverter of the second stage and the operation of the inverter of the third stage and thus, at time t34, the voltage of the node GIN remains at the "H" level.

At time t35, the transistor Tr9 goes into the OFF state and the transistor Tr10 goes into the ON state. Following this, the voltage of the node GIN goes to the "L" level. Following this, the transistor Tr14 goes into the OFF state and the ON current $I_s$ stops.

By doing as described above, the operation of the power supply protection circuit 23 when the surge is applied is ended.

On the other hand, in a case where the normal power supply voltage is applied to the pad P1, the voltage of the pad P1 does not reach the Vlim1 at time t32, the voltage of the node VTHIRD is pulled up to the "H" level by the voltage of the pad P1. For that reason, the voltage of the node VTHIRD is maintained at the "H" level and the ON current $I_s$ does not flow.

By operating as described above, even in the case where the transistors Tr11C to Tr13C and the resistors R3C and R4C are provided between the intermediate node and the pad P1, it is possible to operate in such a way that the ON current $I_s$ is caused to flow at the time of occurrence of the surge and the ON current $I_s$ is not allowed to flow when power is turned on normally. For that reason, the same effects as those of the first embodiment can be obtained.

4.4 Fourth Modification Example

The power supply protection circuit 23 may be provided so that the direction of the RC timer is reversed to those of the embodiments described above, with respect to the pads P1 and P2.

Figure 16:
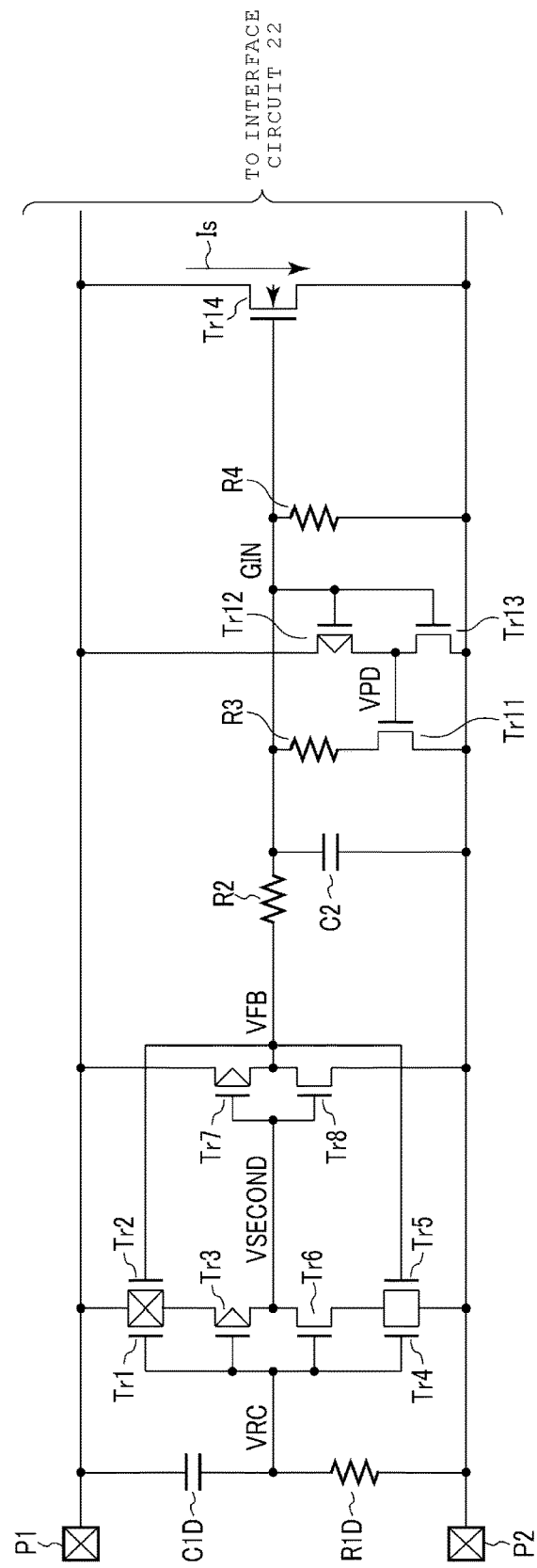
FIG. 16 is a circuit diagram of a power supply protection circuit of a semiconductor memory device system according to a fourth modification example.

FIG. 16 is a circuit diagram illustrating a configuration of a power supply protection circuit of a semiconductor memory device according to a fourth modification example. In FIG. 16, regarding the power supply protection circuit 23 illustrated in the first embodiment, a capacitor C1D and a resistor R1D are used instead of the resistor R1 and the capacitor C1 and also the transistors Tr9 and Tr10 are removed.

As illustrated at FIG. 16, the capacitor C1D includes a first end connected to the pad P1 and a second end connected to the node VRC. The resistor R1D includes a first end connected to the pad P2 and a second end connected to the node VRC.

The gate of the transistor Tr14 is electrically connected to the node VFB, which is the output node of the transistors Tr7 and Tr8 serving as the second stage inverter, through the node GIN.

Figure 17:
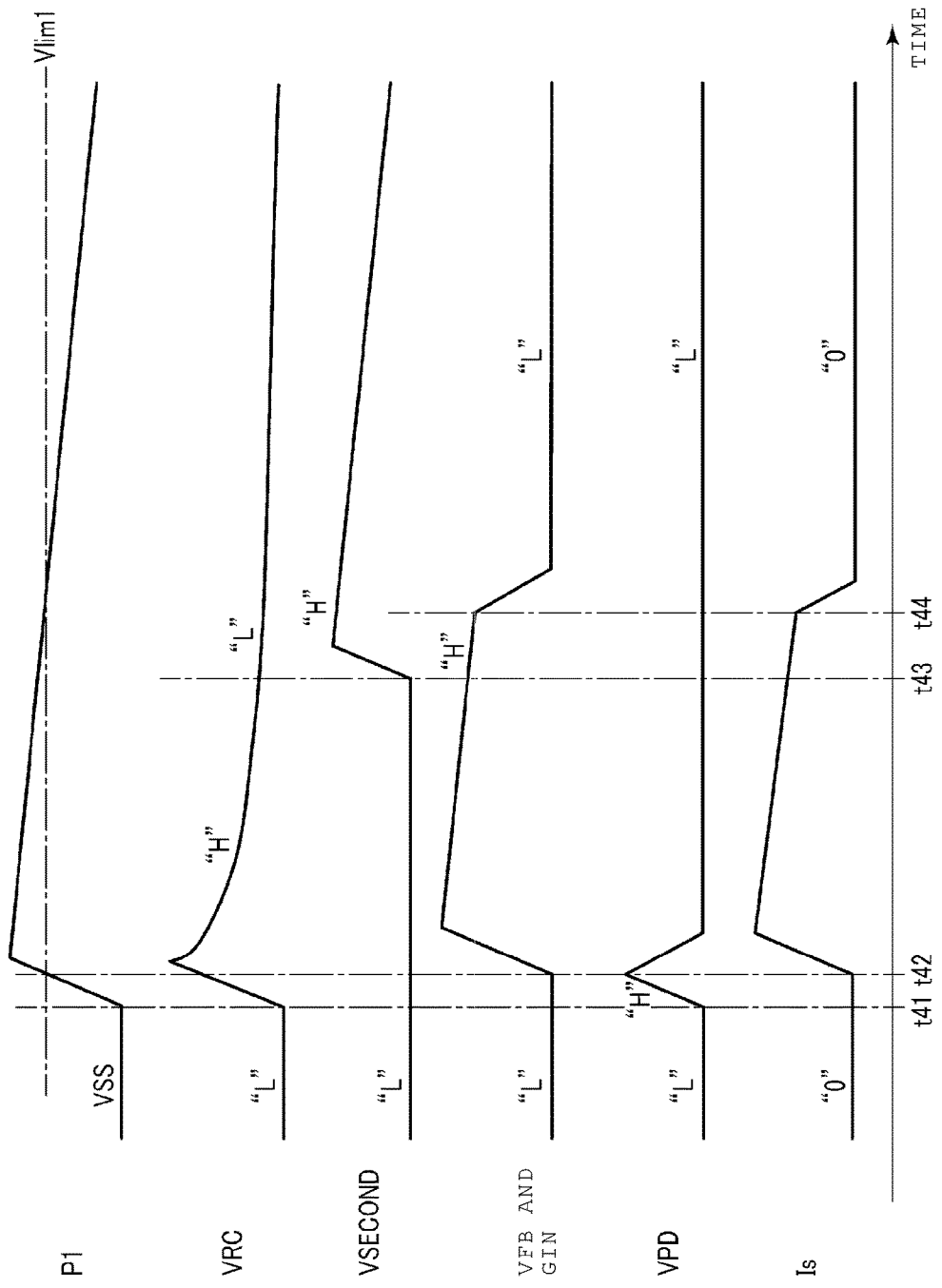
FIG. 17 is a timing chart for explaining an operation of the power supply protection circuit of the semiconductor memory device according to the fourth modification example.

FIG. 17 is a timing chart illustrating the operation of a power supply protection circuit of a semiconductor memory device according to a fourth modification example.

As illustrated in FIG. 17, a surge is applied to the pad P1 at time t41. Following this, the voltage of the pad P1 rapidly rises.

The node VRC follows voltage rise of the pad P1 and goes to the "H" level. Following this, the transistors Tr1 and Tr3 go into the OFF state, and the transistors Tr4 and Tr6 go into the ON state. The node VSECOND is electrically connected to the pad P2 and goes to the "L" level. The voltage of the node VRC gradually decreases according to a time constant of the RC timer.

Here, as described above, the transistor Tr12 operates faster than the transistor Tr7. For that reason, as the voltage of the pad P1 rises, the transistor Tr12 goes into the ON state and the node VPD goes to the "H" level, before the transistor Tr7 goes into the ON state. That is, before the node GIN is electrically connected to the pad P1 through the transistor Tr7, the node VPD is electrically connected to the pad P1 through the transistor Tr12 to cause the transistor Tr11 to be the ON state. With this, the node GIN is electrically connected not only to the resistor R4 but also to the pad P2 through the transistor Tr11 and the resistor R3, and is maintained at the "L" level.

Until the time t42 is reached, the voltage of the pad P1 does not reach the voltage Vlim even after the transistor Tr7 goes into the ON state. For that reason, the node GIN is pulled down to the "L" level by the voltage of the pad P2 based on the magnitude relationship between the impedance of the transistor Tr7 and the combined impedance of the resistor R3 and the transistor Tr11. For that reason, the transistor Tr14 remains at the OFF state during a period from time t41 to time t42.

At time t42, the voltage of the pad P1 reaches the voltage Vlim1. For that reason, the node GIN is pulled up to the "H" level by the voltage of pad P1. Following this, the transistors Tr12 and Tr13 go into the OFF state and the ON state, respectively, and the node VPD goes to the "L" level. Further, the transistor Tr14 goes into the ON state and the ON current $I_s$ starts to flow.

At time t43, when the voltage of the node VRC reaches the "L" level, the transistors Tr1 and Tr3 go into the ON state and the transistors Tr4 and Tr6 go into the OFF state. Following this, the node VSECOND goes to "H" level. The time difference occurs between the operation of the first stage inverter and the operation of the second stage inverter and thus, at time t43, the voltages of the nodes VFB and GIN remain at the "H" level.

At time t44, the transistor Tr7 goes into the OFF state and the transistor Tr8 goes into the ON state. Following this, the voltages of the nodes VFB and GIN go to the "L" level, and the transistor Tr14 goes into the OFF state. For that reason, the ON current $I_s$ stops.

By operating as described above, even when the RC timer is turned to the reverse direction, the power supply protection circuit 23 stops after causing the ON current $I_s$ to flow in accordance with application of the surge.

On the other hand, in a case where the normal power supply voltage is applied to the pad P1, the voltage of the node GIN is pulled down to "L" level by the pad P2 at time t42 and thus, the ON current $I_s$ does not flow.

As such, even when the RC timer is mounted in the reverse direction, it is possible to operate in such a way that the ON current $I_s$ is caused to flow at the time of occurrence of a surge and the ON current $I_s$ is not allowed to flow when the normal power is turned on. Therefore, the same effects as those of the first embodiment can be obtained.

4.5 Fifth Modification Example

In addition, the power supply protection circuit 23 is not limited to the case where the transistor Tr14, through which the ON current $I_s$ flows, has the n channel polarity, and the transistor Tr14 may have the p channel polarity.

Figure 18:
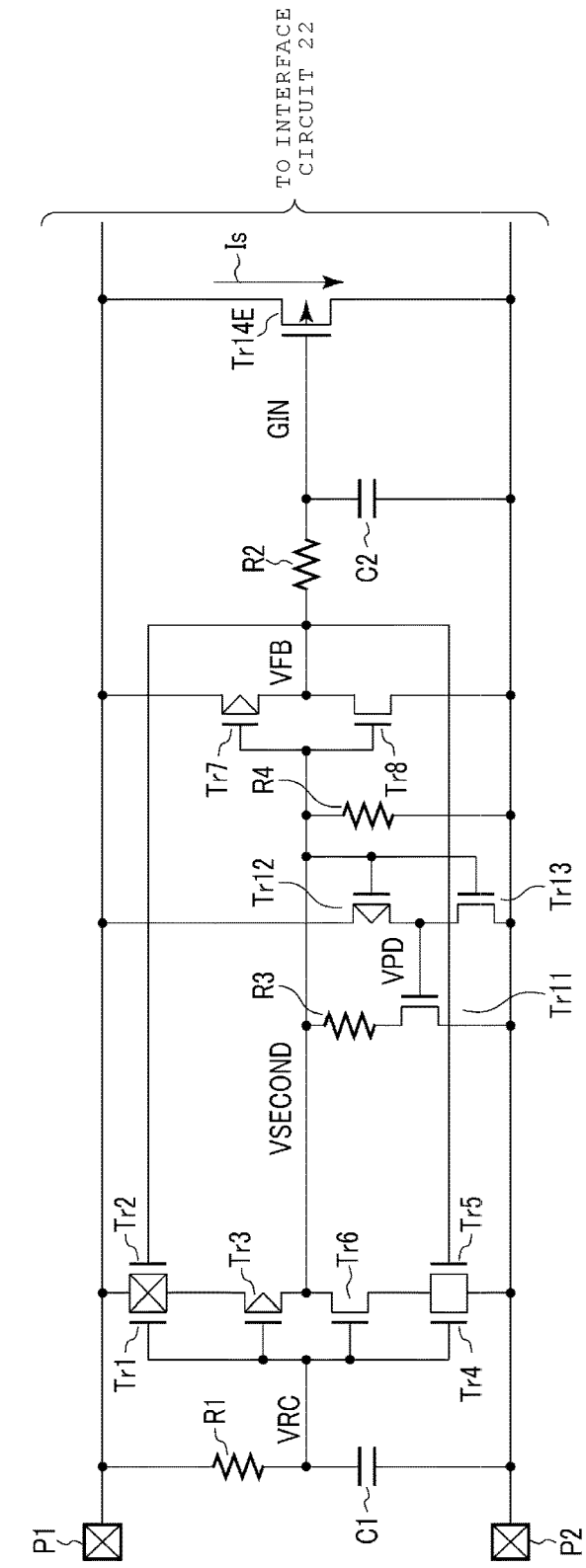
FIG. 18 is a circuit diagram of a power supply protection circuit of a semiconductor memory device system according to a fifth modification example.

FIG. 18 is a circuit diagram illustrating a configuration of a power supply protection circuit of a semiconductor memory device according to a fifth modification example. FIG. 18 illustrates an example in which a transistor Tr14E is used instead of the transistor Tr14 and the transistors Tr9 and Tr10 are excluded, in the power supply protection circuit 23 illustrated in the first embodiment.

As illustrated in FIG. 18, the transistor Tr14E has the p channel polarity. The transistor Tr14E includes a first end connected to the pad P1, a second end connected to the pad P2, and a gate connected to the node GIN.

The gate of the transistor Tr14E is electrically connected to the node VFB, which is the output node of the transistors Tr7 and Tr8 as the second stage inverter, through the node GIN.

Figure 19:
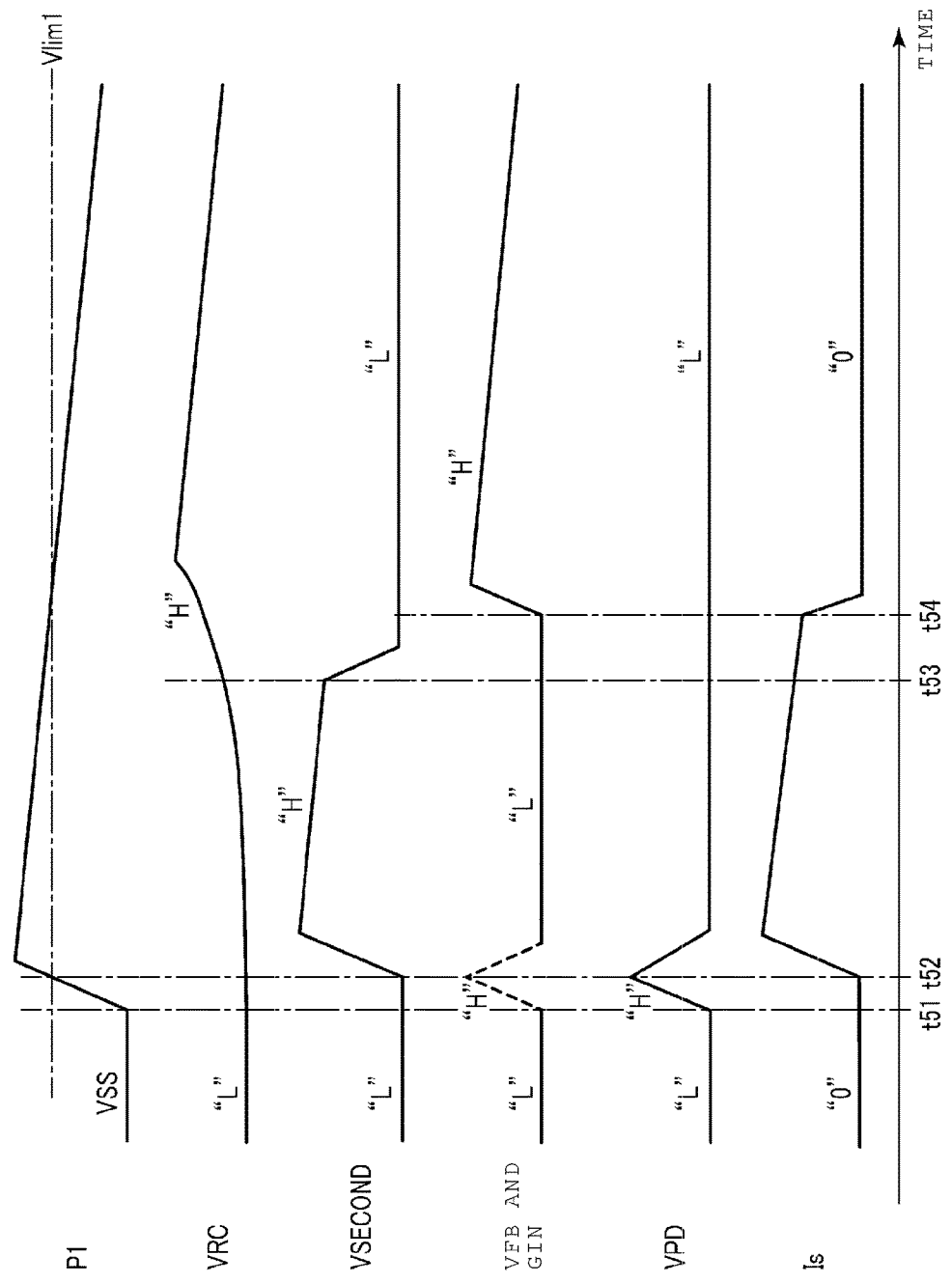
FIG. 19 is a timing chart for explaining an operation of the power supply protection circuit of the semiconductor memory device according to the fifth modification example.

FIG. 19 is a timing chart illustrating the operation of the power supply protection circuit of the semiconductor memory device according to a fifth modification example.

As illustrated at FIG. 19, at time t51, a surge is applied to the pad P1. Following this, the voltage of the pad P1 abruptly rises.

At the node VRC, the voltage starts to gradually rise as charges of the capacitor C1 are sufficiently charged. For that reason, the node VRC does not rise at the same time as the pad P1 and remains for a while at the "L" level. Following this, the transistors Tr1 and Tr3 go into the ON state and the transistors Tr4 and Tr6 go into the OFF state.

Here, as described above, the transistor Tr12 operates faster than the transistors Tr1 and Tr3. For that reason, as the voltage of the pad P1 rises, the transistor Tr12 goes into the ON state and the node VPD goes to the "H" level, before the transistors Tr1 and Tr3 go into the ON state. That is, the node VPD is electrically connected to the pad P1 through the transistor Tr12 and causes the transistor Tr11 to go into the ON state, before the node VSECOND is electrically connected to the pad P1 through the transistors Tr1 and Tr3. With this, the node VSECOND is electrically connected not only to the resistor R4 but also to the pad P2 through the transistor Tr11 and the resistor R3, and is maintained at the "L" level.

Also, until time t52 is reached, the voltage of the pad P1 does not reach the voltage Vlim even after the transistors Tr1 and Tr3 go into the ON state. For that reason, the node VSECOND is pulled down to the "L" level by the voltage of the pad P2 based on the magnitude relationship between the combined impedance of the transistors Tr1 and Tr3 and the combined impedance of the resistor R3 and the transistor Tr11. For that reason, the transistor Tr7 go into the ON state and thus the nodes VFB and GIN go to the "H" level, during a period from time t51 to time t52. The voltage of the pad P1 does not rise sufficiently during the period from the time t51 to the time t52 and thus, the node GIN can become unstable. In either case, the transistor Tr14E remains at the OFF state.

At the time t52, the voltage of the pad P1 reaches the voltage Vlim1. For that reason, the node VSECOND is pulled up to the "H" level by the voltage of pad P1. Following this, the transistors Tr12 and Tr13 go into the OFF state and the ON state, respectively, and the node VPD goes to the "L" level. The transistor Tr7 goes into the ON state and the transistor Tr8 goes into the ON state.

The node GIN is electrically connected to the pad P2 and goes to the "L" level. Following this, the transistor Tr14E goes into the ON state and the ON current $I_s$ starts to flow.

At time t53, when the voltage of the node VRC reaches the "H" level, the transistors Tr1 and Tr3 go into the OFF state and the transistors Tr4 and Tr6 go into the ON state. Following this, the node VSECOND goes to the "L" level. The time difference occurs between the operation of the first stage inverter and the operation of the second stage inverter and thus, at time t53, the voltages of the nodes VFB and GIN remain at the "L" level.

At time t54, the transistor Tr7 goes into the ON state and the transistor Tr8 go into the OFF state. Following this, the voltages of the nodes VFB and GIN go to the "H" level. The transistor Tr14E go into the OFF state and the ON current $I_s$ stops.

By doing as described above, the operation of the power supply protection circuit 23 when the surge is applied is ended.

On the other hand, in a case where the normal power supply voltage is applied to the pad P1, the node VSECOND is pulled down to the "L" level by the pad P2 and maintained at the "L" level even at and after time t52. With this, the voltage of the node GIN is maintained at the "H" level and the ON current $I_s$ does not flow.

As described above, even in a case where the polarity of the transistor through which the ON current $I_s$ flows is made to be the p channel, it is possible to operate in such a way that the ON current $I_s$ is caused to flow at the time of surge occurrence and the ON current $I_s$ is not allowed to flow when normal power is turned on. For that reason, the same effects as those of the first embodiment can be obtained.

4.6 Sixth Modification Example

Figure 20:
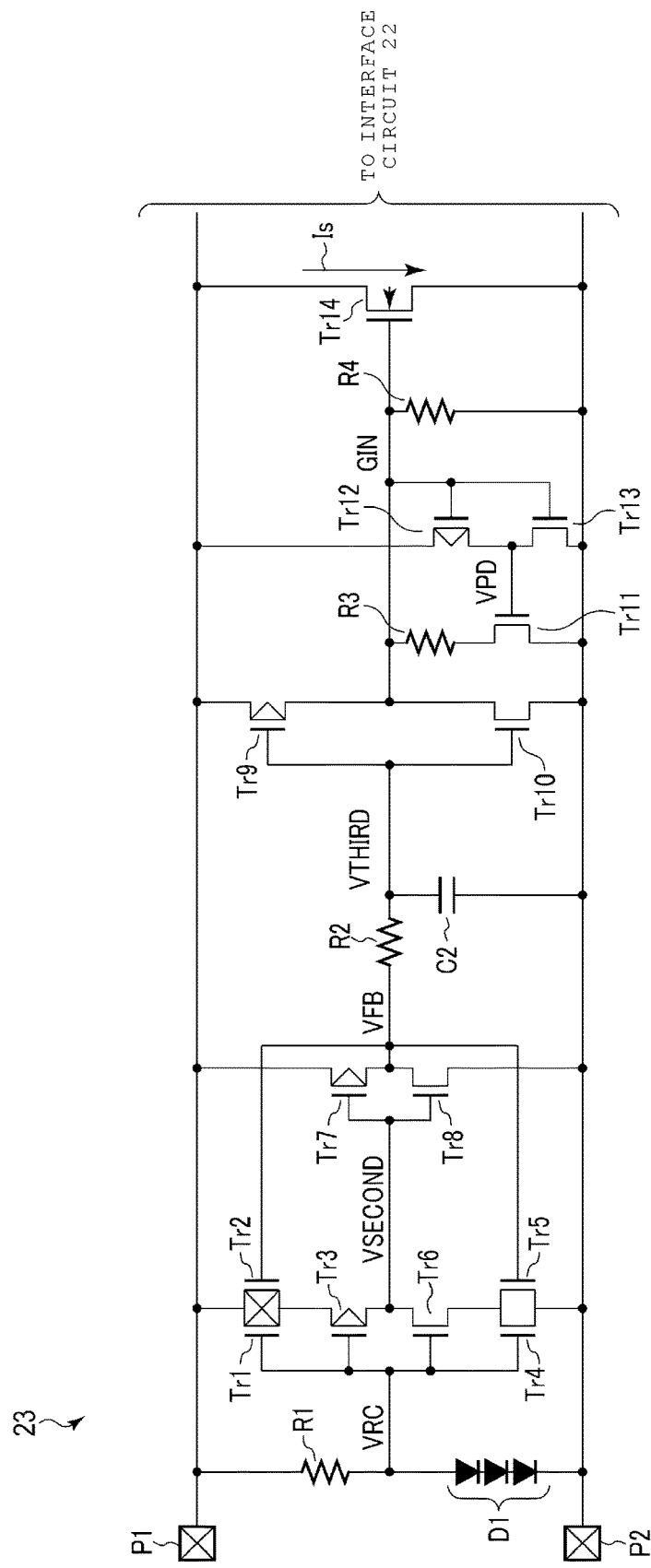
FIG. 20 is a circuit diagram of a power supply protection circuit of a semiconductor memory device system according to a sixth modification example.
Figure 21:
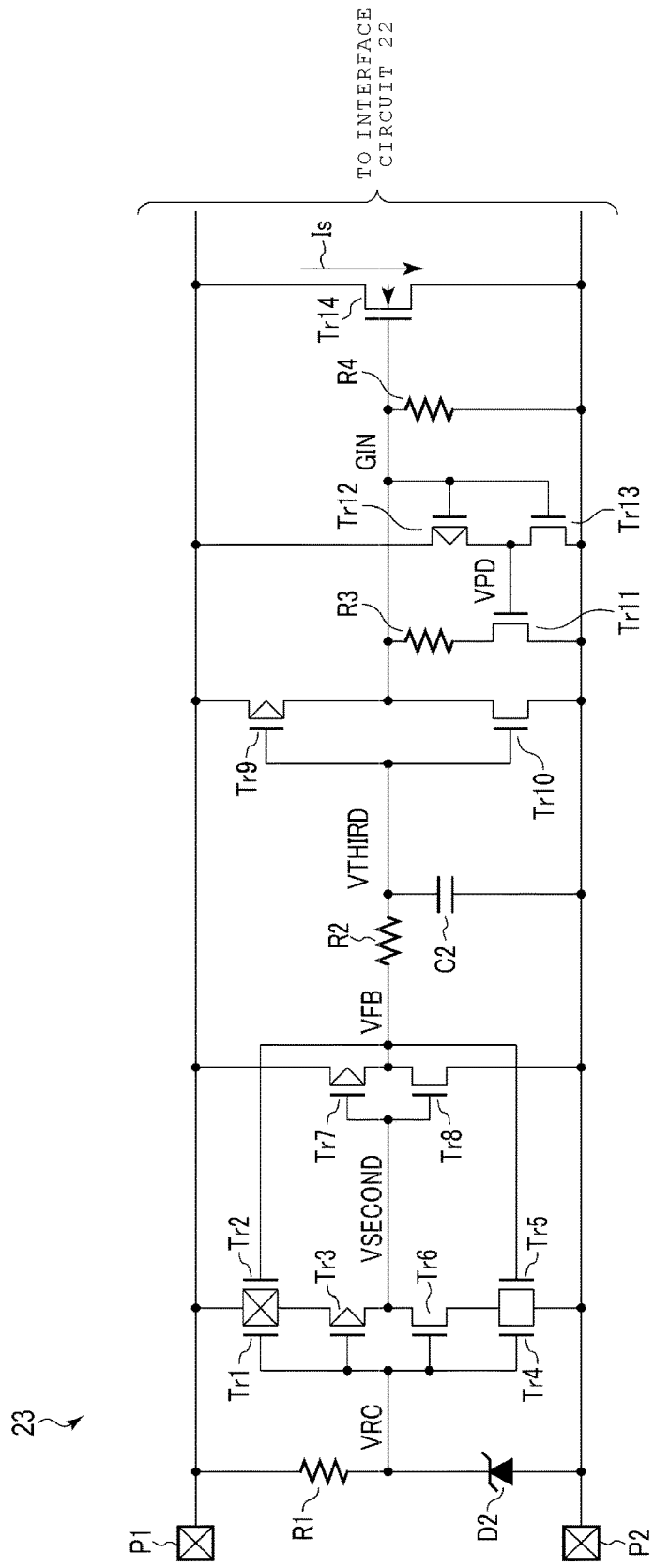
FIG. 21 is another circuit diagram of the power supply protection circuit of a semiconductor memory device system according to the sixth modification example.
Figure 22:
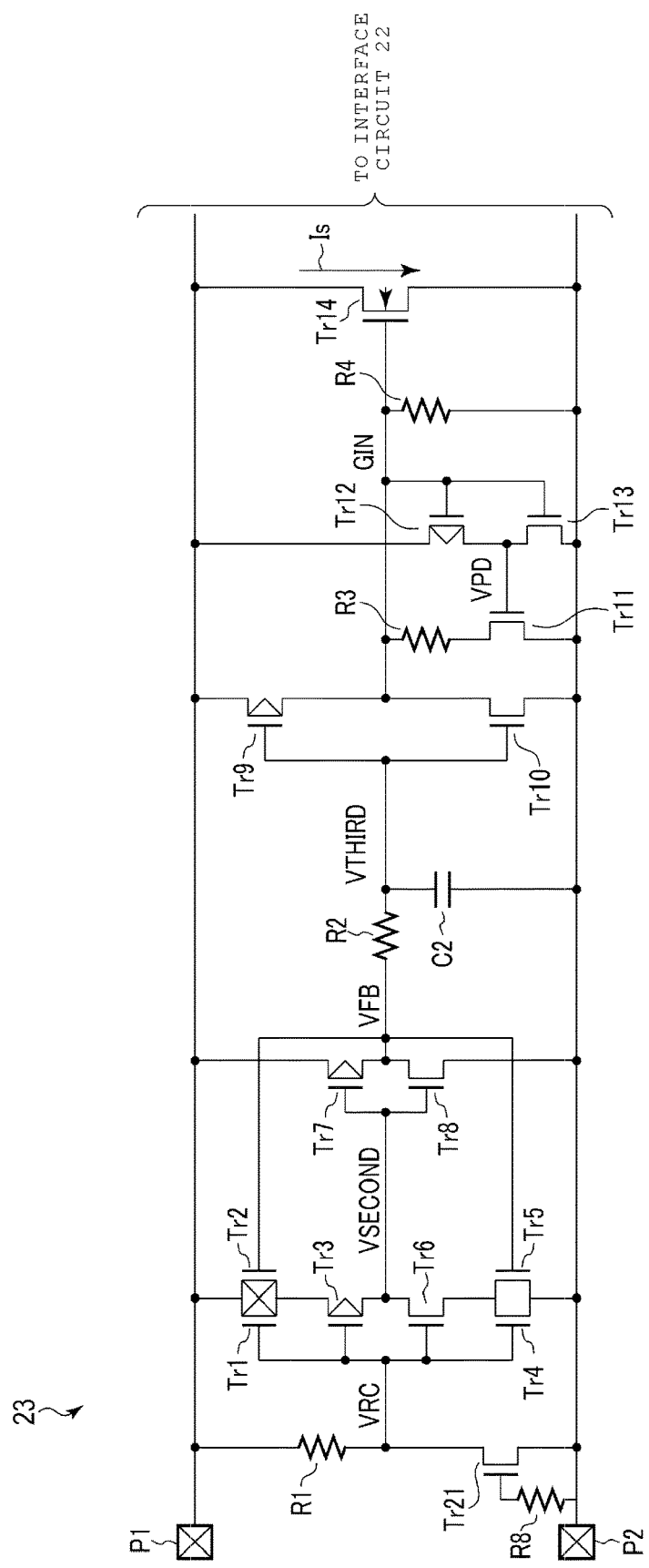
FIG. 22 is still another circuit diagram of the power supply protection circuit of a semiconductor memory device system according to the sixth modification example.

The power supply protection circuit 23 may include not only a trigger circuit having a timer function based on the RC time constant but also other trigger circuits not having the timer function. FIG. 20, FIG. 21, and FIG. 22 are circuit diagrams illustrating a configuration of a power supply protection circuit of a semiconductor memory device according to a sixth modification example.

FIG. 20 illustrates an example in which a plurality of diodes D1 connected in series are used instead of the capacitor C1. As illustrated in FIG. 20, the plurality of diodes D1 include an input end (anode) connected to the node VRC and an output end (cathode) connected to the pad P2. For example, in a case where the voltage of the pad P1 reaches the voltage Vlim1, the plurality of diodes D1 are set to go into the ON state.

With such a configuration, when the plurality of diodes D1 go into the ON state, the voltage of the node VRC decreases due to a voltage drop occurring in the resistor R1, and goes to the "L" level. With this, the transistors Tr2 and Tr3 are brought into the ON state, and the ON current $I_s$ can flow similarly as in the first embodiment. When the voltage of the pad P1 returns to the normal operation range, the plurality of diodes D1 go into the OFF state. For that reason, the voltage drop occurring in the resistor R1 is almost eliminated and the voltage of the node VRC goes to the "H" level. With this, the ON current $I_s$ can be stopped.

FIG. 21 illustrates an example in which a Zener diode D2 is used instead of the capacitor C1. As illustrated in FIG. 21, the Zener diode D2 includes an input end (cathode) connected to the node VRC and an output end (anode) connected to the pad P2. The Zener diode D2 is set to become a breakdown state, for example, in a case where the voltage of the pad P1 reaches the voltage Vlim1.

With such a configuration, when the Zener diode D2 is brought into the breakdown state, the voltage of the node VRC decreases due to the voltage drop occurring in the resistor R1, and goes to the "L" level. With this, the transistors Tr2 and Tr3 are brought into the ON state, and the ON current $I_s$ can flow similarly as in the first embodiment. When the voltage of the pad P1 returns to the normal operation range, the Zener diode D2 is recovered from the breakdown state. For that reason, the voltage drop occurring in the resistor R1 is almost eliminated, and the voltage of the node VRC goes to the "H" level. With this, the ON current $I_s$ can be stopped.

FIG. 22 illustrates an example in which a transistor Tr21 and a resistor R8 are used instead of the capacitor C1. As illustrated in FIG. 22, the transistor Tr21 includes a first end connected to the node VRC and a second end connected to the pad P2. The resistor R8 includes a first end connected to a gate of the transistor Tr21 and a second end connected to the pad P2. Similar to the Zener diode D2 in FIG. 21, for example, in a case where the voltage of the pad P1 reaches the voltage Vlim1, the transistor Tr21 is set to become the breakdown state.

With such a configuration, when the transistor Tr21 is brought into the breakdown state, the voltage of the node VRC decreases due to the voltage drop occurring in the resistor R1 and goes to the "L" level. With this, the transistors Tr2 and Tr3 are brought into the ON state, and the ON current $I_s$ can flow similarly as in the first embodiment. Also, when the voltage of the pad P1 returns to the normal operation range, the transistor Tr21 recovers from the breakdown state. For that reason, the voltage drop occurring in the resistor R1 is almost eliminated, and the voltage of the node VRC goes to the "H" level. With this, the ON current $I_s$ can be stopped.

4.7 Seventh Modification Example

In addition, the power supply protection circuit 23 is not limited to a system that controls an input signal to the gate of the transistor Tr14 according to the voltage of the pad P1 like the transistors Tr11 to Tr13 in the embodiments described above. For example, the power supply protection circuit 23 may switch the switch provided in the current path of the transistor Tr14 according to the voltage of the pad P1.

Figure 23:
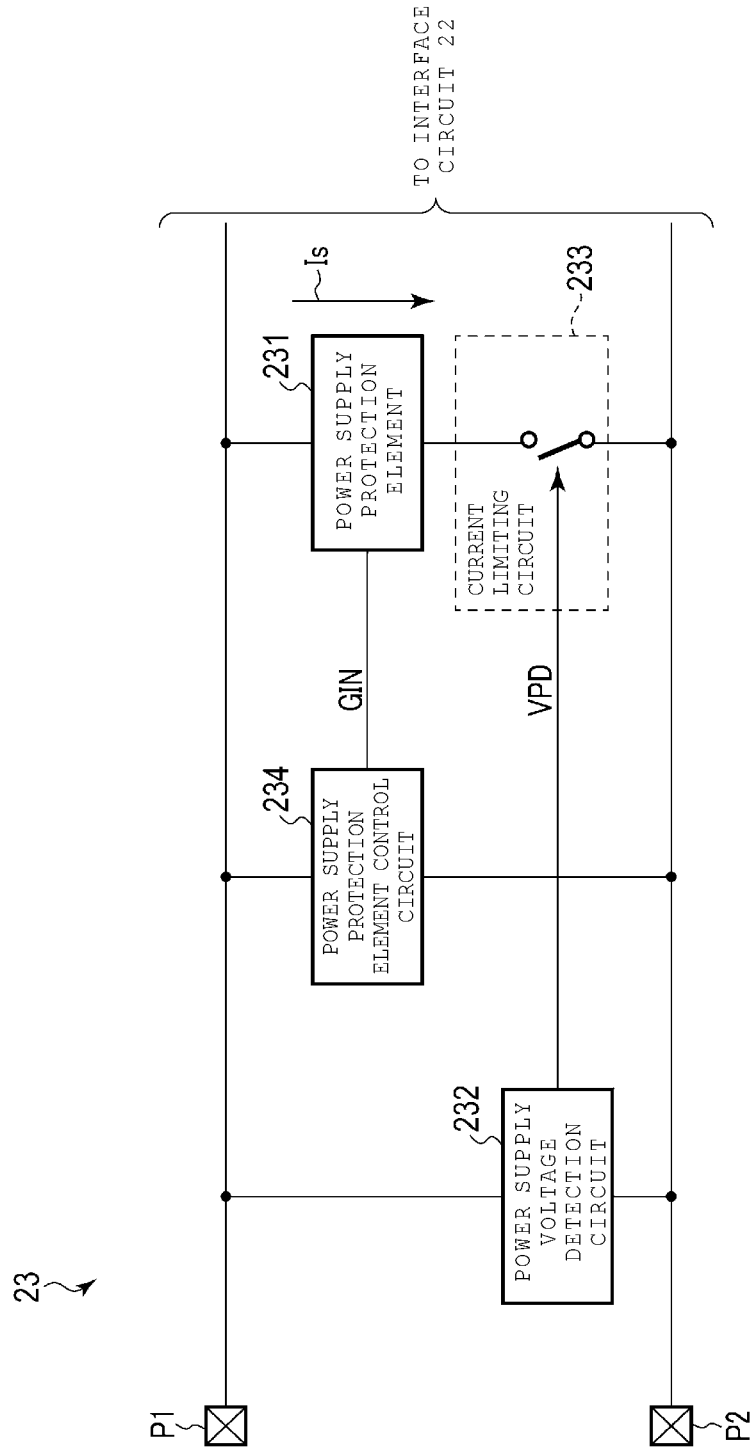
FIG. 23 is a block diagram of a power supply protection circuit of a semiconductor memory device system according to a seventh modification example.

FIG. 23 is a block diagram for explaining a configuration of a power supply protection circuit of a semiconductor memory device according to a seventh modification example. FIG. 23 corresponds to FIG. 2 described in the first embodiment.

As illustrated in FIG. 23, the current limiting circuit 233 includes a switch having a first end connected to the second end of the power supply protection element 231, a second end connected to the pad P2, and an input end connected to the power supply voltage detection circuit 232. With such a configuration, the current limiting circuit 233 can control the ON and OFF of the current path of the ON current $I_s$, not a control signal input to the power supply protection element 231 through the node GIN.

A specific circuit configuration example of the power supply protection circuit 23 described above will be described using FIG. 24.

Figure 24:
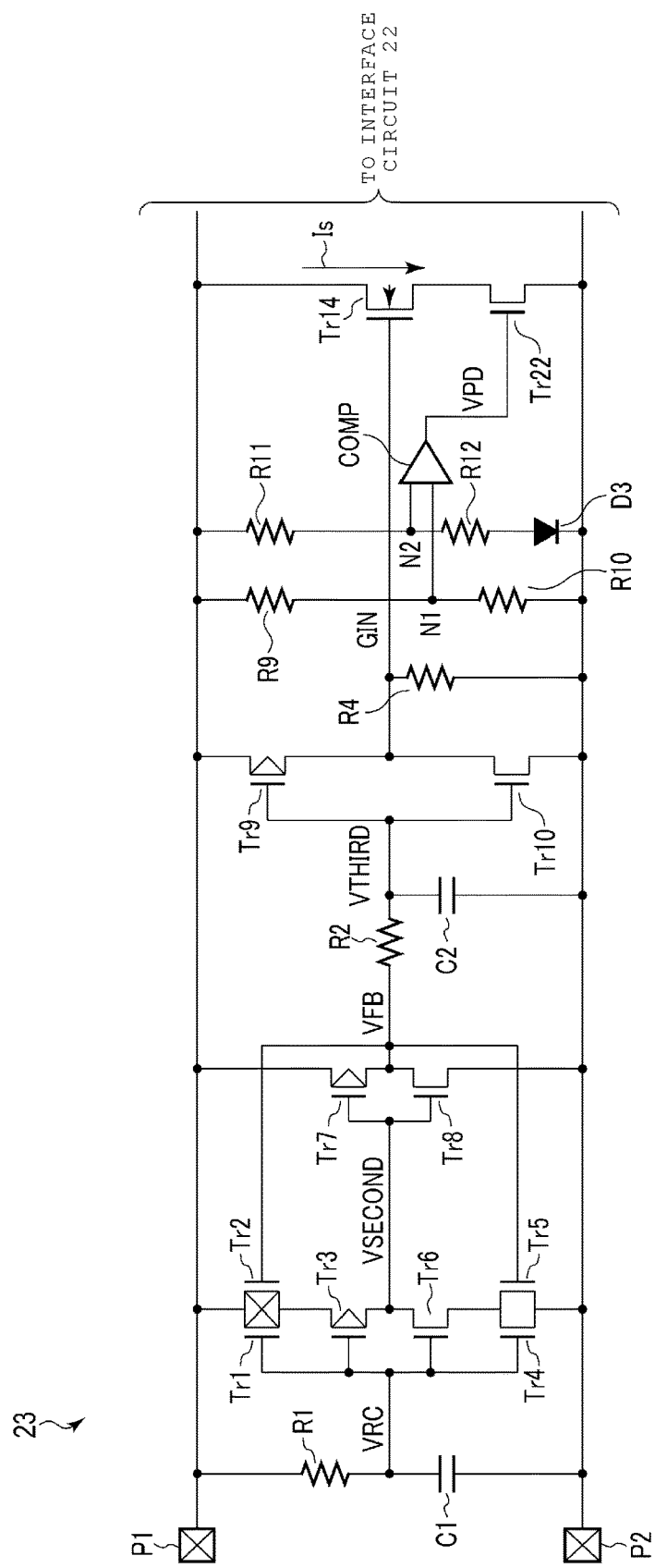
FIG. 24 is a circuit diagram of the power supply protection circuit of the semiconductor memory device system according to the seventh modification example.

FIG. 24 is a circuit diagram for explaining a configuration of a power supply protection circuit of a semiconductor memory device according to a seventh modification example. As illustrated in FIG. 24, the power supply protection circuit 23 includes resistors R9, R10, R11, and R12, a diode D3, a comparator COMP, and a transistor Tr22, instead of the transistors Tr11 to Tr13 and the resistor R3. The resistors R9 to R12, the diode D3, and the comparator COMP function as a power supply voltage detection circuit 232, and the transistor Tr22 functions as the current limiting circuit 233.

The resistor R9 includes a first end connected to the pad P1 and a second end connected to the node N1. The resistor R10 includes a first end connected to the pad P2 and a second end connected to a node N1.

The resistor R11 includes a first end connected to the pad P1 and a second end connected to a node N2. Resistor R12 includes a first end connected to node N2. The diode D3 includes an input end (anode) connected to the second end of the resistor R11 and an output end (cathode) connected to the pad P2.

The comparator COMP includes a first input end connected to the node N1, a second input end connected to the node N2, and an output end connected to the gate of the transistor Tr22.

The transistor Tr22 includes a first end connected to the pad P2 and a second end connected to the second end of the transistor Tr14.

The resistors R9 and R10 input a voltage value (fluctuation voltage A), that varies according to the magnitude of the voltage of the pad P1, to the first input end of the comparator COMP. On the other hand, the resistors R11 and R12 input a constant voltage value (constant voltage B) to the second input end of the comparator COMP, regardless of the magnitude of the voltage of the pad P1. The comparator COMP compares the magnitudes of the fluctuation voltage A and the constant voltage B and outputs a signal of "H" level or "L" level to the gate of the transistor Tr22 according to the magnitude relationship between the fluctuation voltage A and the constant voltage B. For example, in a case where the fluctuation voltage A is larger than the constant voltage B, the comparator COMP outputs the "H" level and causes the transistor Tr22 to go into the ON state, and in a case where the fluctuation voltage A is smaller than the constant voltage B, the comparator COMP outputs the "L" level and causes the transistor Tr22 to go into the OFF state.

With such a configuration as described above, it is possible to operate in such a way that the ON current $I_s$ is caused to flow at the time of occurrence of surge and the ON current $I_s$ is not allowed to flow when normal power is turned on. Specifically, for example, the resistors R9 to R12 and the diode D3 are designed in such a way that when the voltage of the pad P1 reaches the voltage Vlim1, the fluctuation voltage A exceeds the constant voltage B, and when the fluctuation voltage A does not reach the voltage Vlim1, the fluctuation voltage A is less than the constant voltage B. With this, the transistor Tr22 go into the ON state when a surge occurs, and the current path of the ON current $I_s$ from the pad P1 to the pad P2 is opened. On the other hand, when the normal power is turned on, the transistor Tr22 go into the OFF state and the current path of the ON current $I_s$ is closed. For that reason, it is possible to reduce the ON current $I_s$ flowing when the normal power is turned on.

4.8 Eighth Modification Example

In addition, the power supply protection circuit 23 is not limited to a case of including the power supply protection element control circuit 234 as in each of the embodiments described above. For example, the power supply protection circuit 23 may also be applied to the power supply protection element 231 which does not receive a control signal from the power supply protection element control circuit 234, not the power supply protection element 231 such as an RCTMOS circuit operated by receiving the control signal from the power supply protection element control circuit 234.

Figure 25:
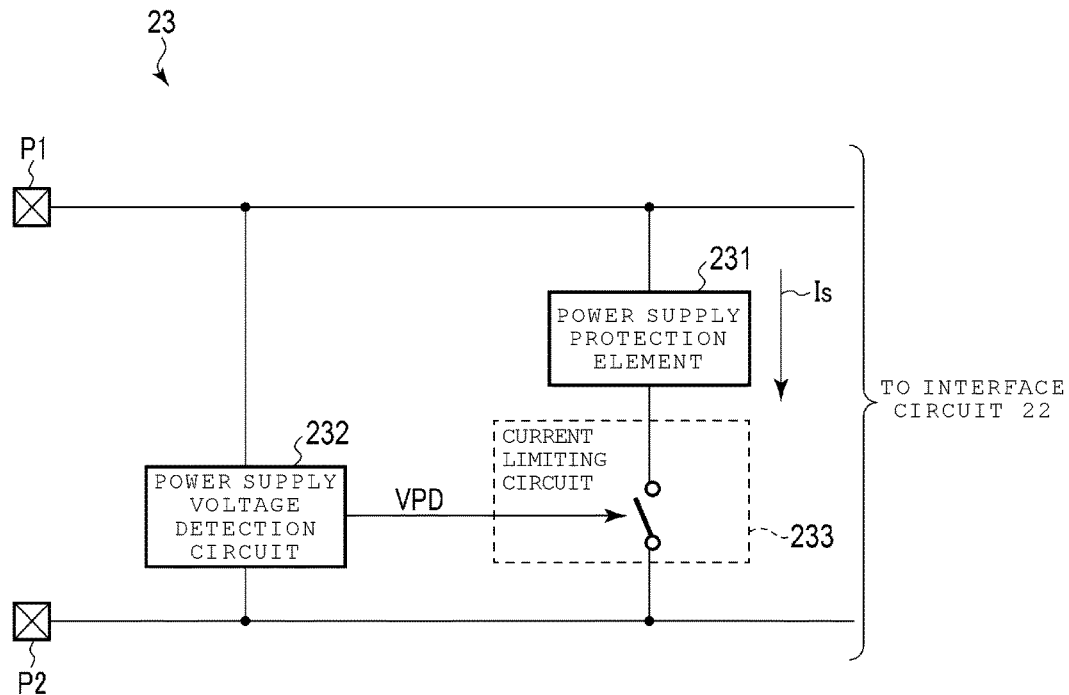
FIG. 25 is a block diagram of a power supply protection circuit of a semiconductor memory device system according to an eighth modification example.

FIG. 25 is a block diagram for explaining a configuration of a power supply protection circuit of a semiconductor memory device according to an eighth modification example. FIG. 25 corresponds to FIG. 23 described in the seventh modification example.

As illustrated in FIG. 25, the power supply protection circuit 23 may have a configuration in which the power supply protection element control circuit 234 is not included. In this case, the power supply protection element 231 can allow the ON current $I_s$ to flow from the pad P1 to the pad P2 without receiving the control signal. Even in the configuration as described above, the current limiting circuit 233 can control ON/OFF of the current path of the ON current $I_s$.

A specific example of the circuit configuration of the power supply protection circuit 23 described above will be described using FIG. 26.

Figure 26:
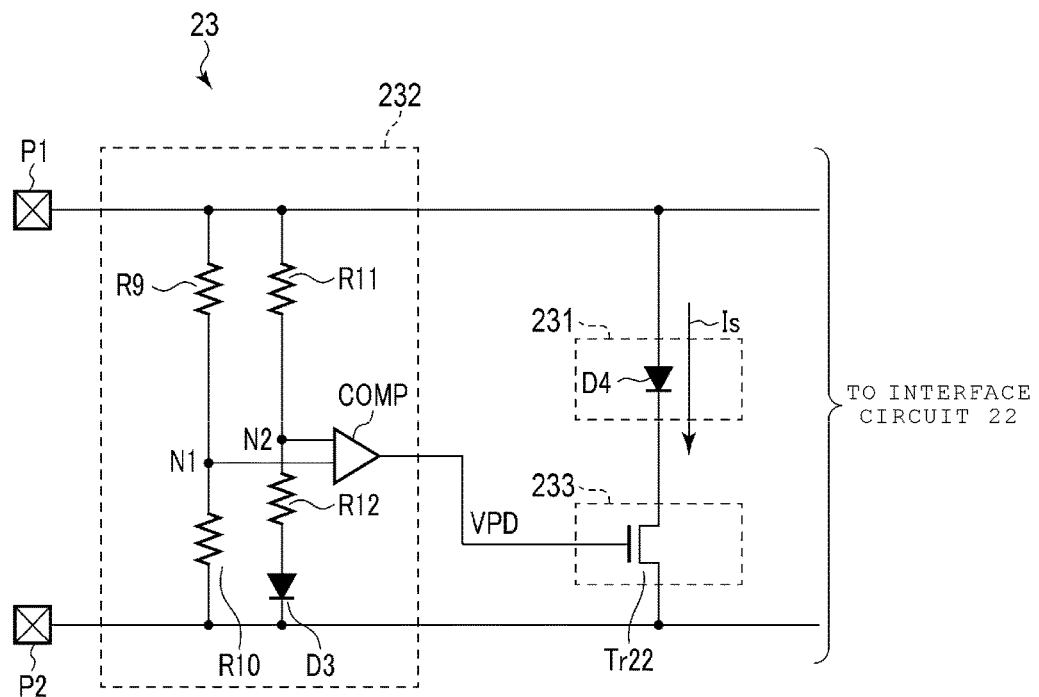
FIG. 26 is a circuit diagram of the power supply protection circuit of the semiconductor memory device system according to the eighth modification example.

FIG. 26 is a circuit diagram for explaining the configuration of the power supply protection circuit of the semiconductor memory device according to the eighth modification example. As illustrated in FIG. 26, the power supply protection circuit 23 includes the resistors R9, R10, R11, and R12, the diodes D3 and D4, the comparator COMP, and the transistor Tr22.

Matters that the resistors R9 to R12, the comparator COMP, and the diode D3 function as the power supply voltage detection circuit 232 and matters the transistor Tr22 functions as the current limiting circuit 233 are the same as in the seventh modification example, description thereof will be omitted.

The diode D4 includes an input end connected to the pad P1 and an output end connected to the second end of the transistor Tr22.

With such a configuration as described above, it is possible to operate in such a way that the ON current $I_s$ is caused to flow at the time of occurrence of surge and the ON current $I_s$ is not allowed to flow when normal power is turned on. Specifically, for example, when a surge occurs, the transistor Tr22 goes into the ON state and the current path of the ON current $I_s$ from the pad P1 to the pad P2 is opened. On the other hand, when normal power is turned on, the transistor Tr22 goes into the OFF state and the current path of the ON current $I_s$ is closed. For that reason, it is possible to reduce the ON current $I_s$ flowing when normal power is turned on.

5. Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein maybe made without departing from the spirit of the inventions. The accompanying claims and their equivalents are intended to cover such forms or modification examples as would fall within the scope and spirit of the inventions.

What is claimed is:

1. A semiconductor memory device, comprising:
a first pad to which a first voltage is supplied;
a second pad to which a second voltage different from the first voltage is supplied; and
a power supply protection circuit including:
a first transistor including a first end electrically connected to the first pad and a second end electrically connected to a first node, a second transistor including a first end electrically connected to the second pad and a second end electrically connected to the first node, a third transistor including a first end electrically connected to the second pad, a second end electrically connected to the first node, and a gate electrically connected to a second node, and having a size different from that of the second transistor, a fourth transistor including a first end electrically connected to the first pad, a second end electrically connected to the second node, and a gate electrically connected to the first node, and a fifth transistor including a first end electrically connected to the second pad, a second end electrically connected to the second node, and a gate electrically connected to the first node.

2. The semiconductor memory device according to claim 1, wherein the first transistor has a polarity different from polarities of the second transistor and the third transistor.

3. The semiconductor memory device according to claim 2, wherein the fourth transistor has a polarity different from a polarity of the fifth transistor.

4. The semiconductor memory device according to claim 1, wherein the fourth transistor has a threshold voltage lower than a threshold voltage of the first transistor.

5. The semiconductor memory device according to claim 1, wherein the power supply protection circuit further includes a first resistor electrically connected in series with the third transistor between the second pad and the first node.

6. The semiconductor memory device according to claim 5, wherein the power supply protection circuit further includes a second resistor electrically connected in series with the first transistor between the first pad and the first node.

7. A semiconductor memory device, comprising:
a memory cell array;
an interface circuit through which commands to read from and write to the memory cell array are to be received;
a power supply protection circuit connected to the interface circuit to supply voltages to the interface circuit;
a first pad through which a first voltage is supplied to the power supply protection circuit; and
a second pad through which a second voltage different from the first voltage is supplied to the power supply protection circuit, wherein
the power supply protection circuit includes:
a first transistor including a first end electrically connected to the first pad and a second end electrically connected to a first node,
a second transistor including a first end electrically connected to the second pad and a second end electrically connected to the first node,
a third transistor including a first end electrically connected to the second pad, a second end electrically connected to the first node, and a gate electrically connected to a second node, and having a size different from that of the second transistor,
a fourth transistor including a first end electrically connected to the first pad, a second end electrically connected to the second node, and a gate electrically connected to the first node, and
a fifth transistor including a first end electrically connected to the second pad, a second end electrically connected to the second node, and a gate electrically connected to the first node.

8. The semiconductor memory device according to claim 7, wherein the first transistor has a polarity different from polarities of the second transistor and the third transistor.

9. The semiconductor memory device according to claim 8, wherein the fourth transistor has a polarity different from a polarity of the fifth transistor.

10. The semiconductor memory device according to claim 7, wherein the fourth transistor has a threshold voltage lower than a threshold voltage of the first transistor.

11. The semiconductor memory device according to claim 7, wherein the power supply protection circuit further includes a first resistor electrically connected in series with the third transistor between the second pad and the first node.

12. The semiconductor memory device according to claim 11, wherein the power supply protection circuit further includes a second resistor electrically connected in series with the first transistor between the first pad and the first node.

13. A method of protecting a semiconductor memory device against a voltage surge at a first pad by turning on a power supply protection transistor connected between the first pad and a second pad, the power supply protection transistor being turned off when there is no voltage surge at the first pad, said method comprising:
in response to a voltage at the first pad exceeding a threshold voltage, pulling up a gate voltage of the power supply protection transistor to turn on the power supply protection transistor and cause a current to flow from the first pad to the second pad; and
in response to the voltage at the first pad not exceeding the threshold voltage, pulling down the gate voltage of the power supply protection transistor to turn off the power supply protection transistor and stop any current from flowing from the first pad to the second pad, wherein
the gate voltage of the power supply protection transistor is equal to a voltage at a first node of the semiconductor memory device, and
the semiconductor memory device includes:
a first transistor including a first end electrically connected to the first pad and a second end electrically connected to the first node,
a second transistor including a first end electrically connected to the second pad and a second end electrically connected to the first node,
a third transistor including a first end electrically connected to the second pad, a second end electrically connected to the first node, and a gate electrically connected to a second node, and having a size different from that of the second transistor,
a fourth transistor including a first end electrically connected to the first pad, a second end electrically connected to the second node, and a gate electrically connected to the first node, and
a fifth transistor including a first end electrically connected to the second pad, a second end electrically connected to the second node, and a gate electrically connected to the first node.

14. The method according to claim 13, wherein the first transistor has a polarity different from polarities of the second transistor and the third transistor.

15. The method according to claim 14, wherein the fourth transistor has a polarity different from a polarity of the fifth transistor.

16. The method according to claim 13, wherein the fourth transistor has a threshold voltage lower than a threshold voltage of the first transistor.

17. The method according to claim 13, wherein the power supply protection circuit further includes a first resistor electrically connected in series with the third transistor between the second pad and the first node.

18. The method according to claim 17, wherein the power supply protection circuit further includes a second resistor electrically connected in series with the first transistor between the first pad and the first node.

19. The method according to claim 13, further comprising:

detecting whether or not the voltage at the first pad exceeds the threshold voltage.

* * * * *